(12) United States Patent
Kihara et al.

(10) Patent No.: US 9,190,977 B2
(45) Date of Patent: Nov. 17, 2015

(54) SEMICONDUCTOR DEVICE AND ADJUSTMENT METHOD OF FILTER CIRCUIT

(71) Applicant: Renesas Electronics Corporation, Kawasaki-shi (JP)

(72) Inventors: Takao Kihara, Kawasaki (JP); Tomohiro Sano, Kawasaki (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 48 days.

(21) Appl. No.: 14/103,509

(22) Filed: Dec. 11, 2013

(65) Prior Publication Data
US 2014/0184356 A1 Jul. 3, 2014

(30) Foreign Application Priority Data
Dec. 27, 2012 (JP) ................................ 2012-285125

(51) Int. Cl.
| | |
|---|---|
| H03K 5/00 | (2006.01) |
| H03H 7/01 | (2006.01) |
| H01L 23/522 | (2006.01) |
| H01L 49/02 | (2006.01) |
| H01L 27/01 | (2006.01) |
| H03H 1/00 | (2006.01) |

(52) U.S. Cl.
CPC ......... *H03H 7/0153* (2013.01); *H01L 23/5223* (2013.01); *H01L 23/5227* (2013.01); *H01L 27/016* (2013.01); *H01L 28/10* (2013.01); *H01L 28/40* (2013.01); *H03H 7/0115* (2013.01); *H03H 7/1791* (2013.01); *H01L 2924/0002* (2013.01); *H03H 2001/0064* (2013.01); *H03H 2001/0078* (2013.01); *H03H 2007/013* (2013.01); *H03H 2210/012* (2013.01); *H03H 2210/025* (2013.01); *H03H 2210/026* (2013.01); *H03H 2210/036* (2013.01)

(58) Field of Classification Search
CPC .................................................. H03H 7/0153
USPC .......... 327/551–559, 335–337; 333/176, 178, 333/174
See application file for complete search history.

(56) References Cited

U.S. PATENT DOCUMENTS

| | | | |
|---|---|---|---|
| 4,287,602 A * | 9/1981 | Kessler | .......................... 455/286 |
| 5,095,285 A | 3/1992 | Khatibzadeh | |
| 8,502,596 B1 * | 8/2013 | Kaunisto et al. | ............... 327/553 |
| 2013/0113300 A1 * | 5/2013 | Zybura et al. | .................. 307/105 |

* cited by examiner

*Primary Examiner* — Dinh Le
(74) *Attorney, Agent, or Firm* — McGinn IP Law Group, PLLC

(57) ABSTRACT

A semiconductor device includes a filter circuit operable to pass a desired signal component of a high-frequency signal inputted and operable to attenuate a harmonic component of an integral multiple of the desired signal, wherein the filter circuit includes a first inductor and a second inductor coupled in series to a signal line transmitting the high-frequency signal, a first variable capacitor coupled between a power supply line and a node of the first inductor and the second inductor, and a second variable capacitor coupled between the signal line and the power supply line.

13 Claims, 17 Drawing Sheets

L1=1.0 nH
L2=1.8 nH
C1=1.0~2.4 pF
C2=0~1.5 pF
CL=2.0 pF

L1=1.0 nH
L2=1.8~2.8 nH
C1=1.0~2.4 pF
CL=2.0 pF

SEMICONDUCTOR DEVICE AND ADJUSTMENT METHOD OF FILTER CIRCUIT

CROSS-REFERENCE TO RELATED APPLICATIONS

The disclosure of Japanese Patent Application No. 2012-285125 filed on Dec. 27, 2013 including the specification, drawings, and abstract is incorporated herein by reference in its entirety.

BACKGROUND

The present invention relates to a semiconductor device, especially to a semiconductor device provided with a filter circuit employed in a radio frequency integrated circuit (RFIC), for example.

In an RFIC (semiconductor device) implemented in wireless communication devices, such as a mobile-phone and a wireless LAN (Local Area Network), a filter circuit for removing an unnecessary out-of-band signal is provided in each of a receiving unit for downconverting a reception RF signal received with an antenna to a reception baseband signal, and a transmitting unit for upconverting a transmission baseband signal to a transmission RF signal. Such a filter circuit is generally configured with the use of an inductor, a capacitor, and a resistive element (refer to Patent Literature 1, for example).

For example, when an LC circuit configured with an inductor and a capacitor coupled in parallel is employed as the filter circuit, input impedance of the filter circuit becomes maximum at a resonance frequency of the LC circuit. Therefore, the filter circuit functions as a kind of band-pass filter which passes a frequency in the neighborhood of the resonance frequency and attenuates a frequency distant from the resonance frequency.

(Patent Literature 1) U.S. Pat. No. 5,095,285

SUMMARY

In a transmitting unit of an RFIC, when upconverting a transmission baseband signal to a transmission RF signal by means of an orthogonal transformer, a harmonic component of an integral multiple of the frequency of a desired signal is generated. In particular, a threefold higher frequency or a third harmonic of the desired signal generates an undesired signal called a C-IM3 (Third-Order Counter-Intermodulation: third-order intermodulation distortion) caused by intermodulation with the desired signal. The C-IM3 acts as an interference signal to other wireless communication devices; therefore, various telecommunications standards applied to the wireless communication devices specify the permissible magnitude of the C-IM3, respectively.

In order to reduce the C-IM3, it is desirable to remove the third harmonic generated by the orthogonal transformer, by means of a filter circuit. Such a filter circuit is required to have the characteristics of passing a desired signal and attenuating a third harmonic, among the transmission RF signals.

On the other hand, in the wireless communication device, moving toward multiband architecture supporting plural frequency bands is advancing currently for the purpose of enhancement of data transmission speed. Therefore, it is necessary for the filter circuit to realize the filter characteristics to various frequency bands. The other issues and new features of the present invention will become clear from the description of the present specification and the accompanying drawings.

A semiconductor device according to one embodiment is provided with a filter circuit which passes a desired signal component of a high-frequency signal inputted and attenuates a threefold higher frequency or a third harmonic component of the desired signal. The filter circuit is provided with a first inductor and a second inductor coupled in series to a signal line transmitting a high-frequency signal; a first variable capacitor coupled between a power supply line and a node of the first inductor and the second inductor; and a second variable capacitor coupled between the signal line and the power supply line. The frequency of the desired signal component is adjusted by capacitance values of the first variable capacitor and the second variable capacitor, and the frequency of the third harmonic component is adjusted by the capacitance value of the first variable capacitor.

According to the one embodiment, it is possible to provide a wide-band filter circuit which passes a desired signal component of a high-frequency signal inputted, and attenuates a harmonic component of an integral multiple of the desired signal.

DETAILED DESCRIPTION

Hereinafter, the embodiments are explained in detail with reference to drawings. The same reference symbol will be attached to the same or corresponding part, and the explanation thereof will not be repeated.

Embodiment 1

An Entire Configuration of an RFIC

Figure 1:
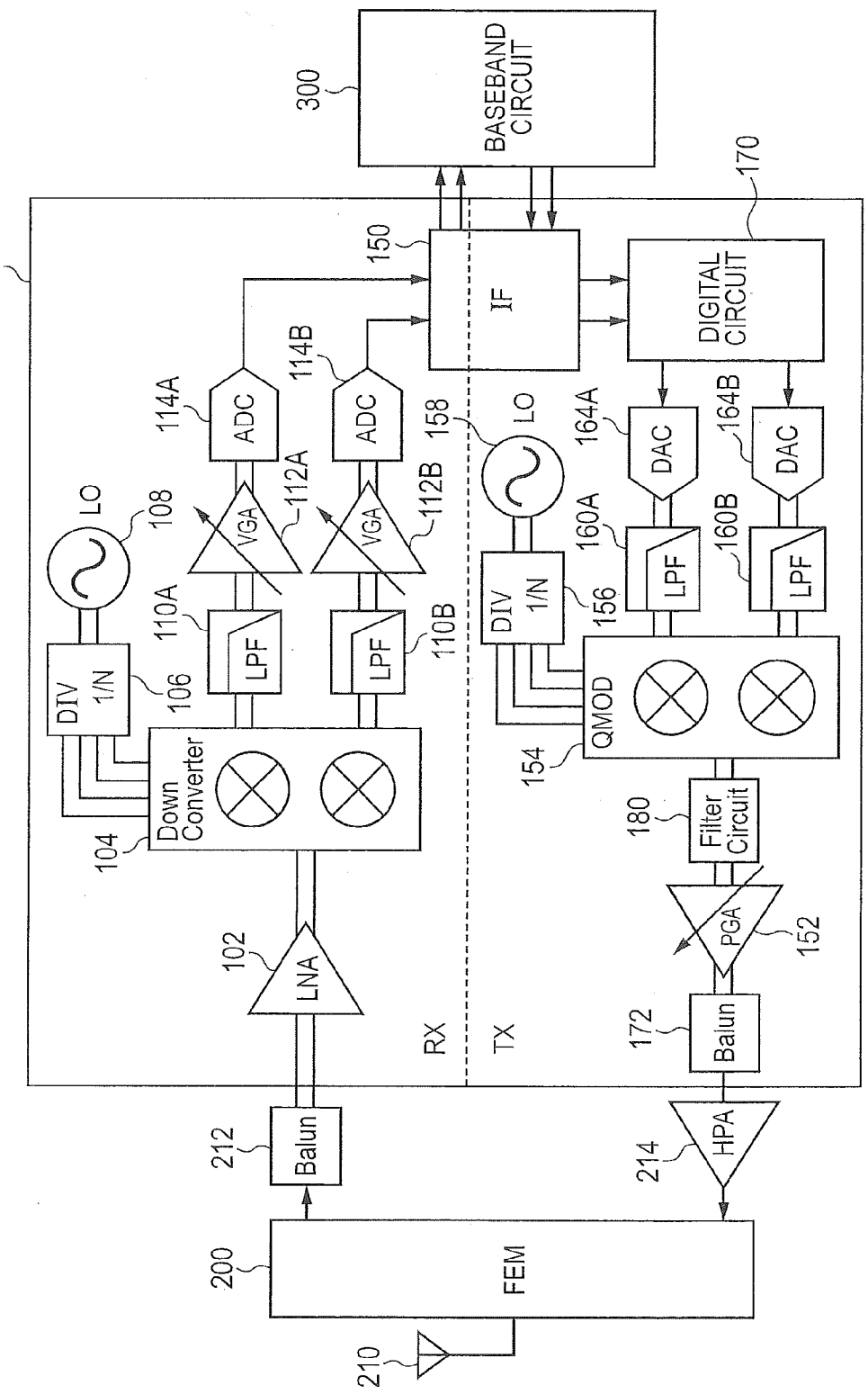
FIG. 1 is a drawing illustrating roughly an entire configuration of a system which mounts an RFIC according to Embodiment 1.

FIG. 1 illustrates roughly an entire configuration of a system which mounts an RFIC according to Embodiment 1. The system illustrated in FIG. 1 is a representative example of a wireless communication device such as a mobile-phone and a wireless LAN (Local Area Network).

As illustrated in FIG. 1, the wireless communication device is configured with an RFIC 100, an FEM (Front End Module) 200, a baseband circuit 300, an antenna 210, a reception balun (balanced-unbalanced transformer) 212, and an HPA (High Power Amplifier) 214. The RFIC 100, the baseband circuit 300, and the HPA 214 are semiconductor devices configured with integrated circuits formed overlying respectively separate semiconductor substrates.

The antenna 210 is employed for transmitting and receiving an RF signal. The FEM 200 switches coupling of the antenna 210 to the reception balun 212 or to the HPA 214, according to reception or transmission. The reception balun 212 converts the reception RF signal supplied by the antenna 210 from a single phase signal into a differential signal, and supplies it to the RFIC 100. The HPA 214 amplifies the transmission RF signal supplied from the RFIC 100, and supplies it to the antenna 210.

The baseband circuit 300 transfers data to and from the RFIC 100. Although not shown, the baseband circuit 300 is configured with a control circuit for controlling the RFIC 100, a clock generation circuit for generating a clock signal to be supplied to the RFIC 100, and others.

The RFIC 100 is configured with a receiving unit RX, a transmitting unit TX, and an IF (Interface) 150 for a digital RF. The receiving unit RX downconverts the reception RF signal received by the antenna 210 to an analog reception baseband signal with the use of a local oscillation signal (local carrier signal). The receiving unit RX performs AD (analog to digital) conversion of an analog reception baseband signal to generate a digital reception baseband signal.

Specifically, the receiving unit RX is configured with an LNA (Low Noise Amplifier) 102, a downconverter (frequency converter) 104, a DIV (divider) 106, an LO (Local Oscillator) 108, LPFs (Low Pass Filters) 110A and 110B, VGAs (Variable Gain Amplifiers) 112A and 112B, and ADCs (Analog-to-Digital Converters) 114A and 114B.

The LNA 102 performs the low noise amplification of the received reception RF signal. The reception RF signal after the low noise amplification is downconverted by the downconverter 104 to an analog reception baseband signal. When described in detail, the LO 108 generates a local oscillation signal of the differential signal to be used by the DIV 106. According to a dividing ratio, the DIV 106 divides the frequency of the local oscillation signal generated by the LO 108, to generate a local oscillation signal of which the frequency differs for every band to be employed. The downconverter 104 mixes the local oscillation signal generated by the DIV 106 with the reception RF signal to generate an I signal as an in-phase component. Furthermore, the downconverter 104 mixes the local oscillation signal with the reception RF signal to generate a Q signal as a quadrature-phase component. The analog I signal and Q signal, which are differential signals generated by the downconverter 104, pass the LPFs 110A and 110B, respectively, and a frequency component of a band higher than a cut-off frequency is removed.

The VGAs 112A and 112B perform respectively level adjustment of the analog I signal and Q signal generated by the downconverter 104, and output the analog I signal and Q signal to the ADCs 114A and 1143, respectively. The ADCs 114A and 1143 convert respectively the analog I signal and Q signal outputted by the VGAs 112A and 112B into digital I signal and Q signal, and output the digital I signal and Q signal to the IF 150.

The IF 150 is an interface for coupling the RFIC 100 and the baseband circuit 300. The IF 150 conforms to the interface specification decided by the MIPI (Mobile Industry Processor Interface) Alliance. The baseband circuit 300 demodulates the digital I signal and Q signal received via the IF 150, to obtain a digital reception baseband signal as the receive data.

The transmitting unit TX perform D/A (digital to analog) conversion to the digital transmission baseband signal generated by the baseband circuit 300, to generate an analog transmission baseband signal, and upconverts the generated analog transmission baseband signal to a transmission RF signal by use of the local oscillation signal. Then, the transmitting unit TX transmits the transmission RF signal to a base station by wireless via the antenna 210.

Specifically, the transmitting unit TX is configured with a digital circuit 170, DACs (Digital-to-Analog Converters) 164A and 164B, LPFs 160A and 160B, a DIV 156, an LO 158, a QMOD (Quadrature Modulator) 154, a PGA (Programmable Gain Amplifier) 152, and a transmission balun 172.

The digital circuit 170 receives a digital transmission baseband signal as the transmit data from the baseband circuit 300 via the IF 150. Although not shown, the digital circuit 170 is configured with a demultiplexer and a DPGA (Digital Programmable Gain Amplifier). The transmission baseband signal (transmit data) received from the baseband circuit 300 via the IF 150 is a 1-bit data signal transferred serially, and includes an I signal and a Q signal. The demultiplexer separates (demultiplexer) the I signal and Q signal transferred serially, and converts the serial I signal and Q signal into a parallel signal formed by plural bits. The DPGA amplifies the digital I signal converted into a parallel signal, and amplifies similarly the digital Q signal converted into a parallel signal.

The DACs 164A and 164B convert the digital I signal and Q signal amplified by the DPGA into the analog I signal and Q signal as differential signals. The analog I signal and Q signal converted by the DACs 164A and 164B pass the LPFs 160A and 160B, respectively, and a frequency component of a band higher than the cut-off frequency is removed.

The LO 158 generates a local oscillation signal of the differential signal used by the DIV 156. According to a dividing ratio, the DIV 156 divides the frequency of the local oscillation signal generated by the LO 158, to generate a local oscillation signal of which the frequency differs for every band to be employed.

The QMOD 154 receives the local oscillation signal corresponding to the band to be employed and the analog I signal and Q signal which have passed the LPFs 160A and 160B. The QMOD 154 generates an analog transmission RF signal by upconverting the I signal and Q signal to the frequency of the local oscillation signal through the multiplication of the I signal and Q signal with the local oscillation signal. The QMOD 154 outputs the generated transmission RF signal to the PGA 152.

The PGA 152 is a transmission amplifier circuit and amplifies the transmission RF signal generated by the QMOD 154. The transmission balun 172 converts the transmission RF signal supplied from the PGA 152 from the differential signal into a single phase signal, and supplies it to the HPA 214. The HPA 214 amplifies the transmission RF signal supplied from the RFIC 100 and supplies it to the antenna 210.

Although not shown, it is preferable that the RFIC 100 may include plural output terminals Tx1 to Txn (n is a natural number of 2 or greater) for outputting the transmission RF signal, and plural input terminals Rx1 to Rxn for inputting the reception RF signal. In this case, the output terminal and the input terminal make a pair of an output terminal and an input terminal, such as (Tx1, Rx1), ..., (Txn, Rxn), and a pair of the output terminal and the input terminal to be employed is determined corresponding to the band which the RFIC 100 employs.

Currently, as a wireless communication device, the W-CDMA (Wideband Code Division Multiple Access) which is a telecommunications standard of the third generation (3G) has spread widely. The W-CDMA is realized by the FDD-CDMA (Frequency Division Duplex-Code Division Multiple Access) system, and known as a UMTS (Universal Mobile Telecommunications System) in Europe and America. These days, an LTE (Long Term Evolution) is being adopted as a telecommunications standard of the 3.9th generation (3.9G) which has attained speed enhancement and globalization further than the W-CDMA. In the LTE, the downlink employs an OFDMA (Orthogonal Frequency Division Multiple Access), and the uplink employs an SC-FDMA (Single Carrier Frequency Division Multiple Access).

In an RFIC mounted in a wireless communication device which supports the LTE, it is required that the transmitting unit TX realizes lower distortion properties and better multi-band (wide band) operation than one supporting the W-CDMA. As one of the low distortion properties, it is required that the C-IM3 (third-order intermodulation distortion) included in a transmission RF signal outputted from the transmitting unit TX is small as compared with that of one supporting the W-CDMA. As illustrated in FIG. 1, when the HPA 214 amplifies the transmission RF signal outputted from the transmitting unit TX, an undesired signal arising from the C-IM3 is generated from the HPA 214. This undesired signal acts as an interference signal to other wireless communication devices. Therefore, the permissible magnitude of the C-IM3 is specified in the LTE.

Figure 2:
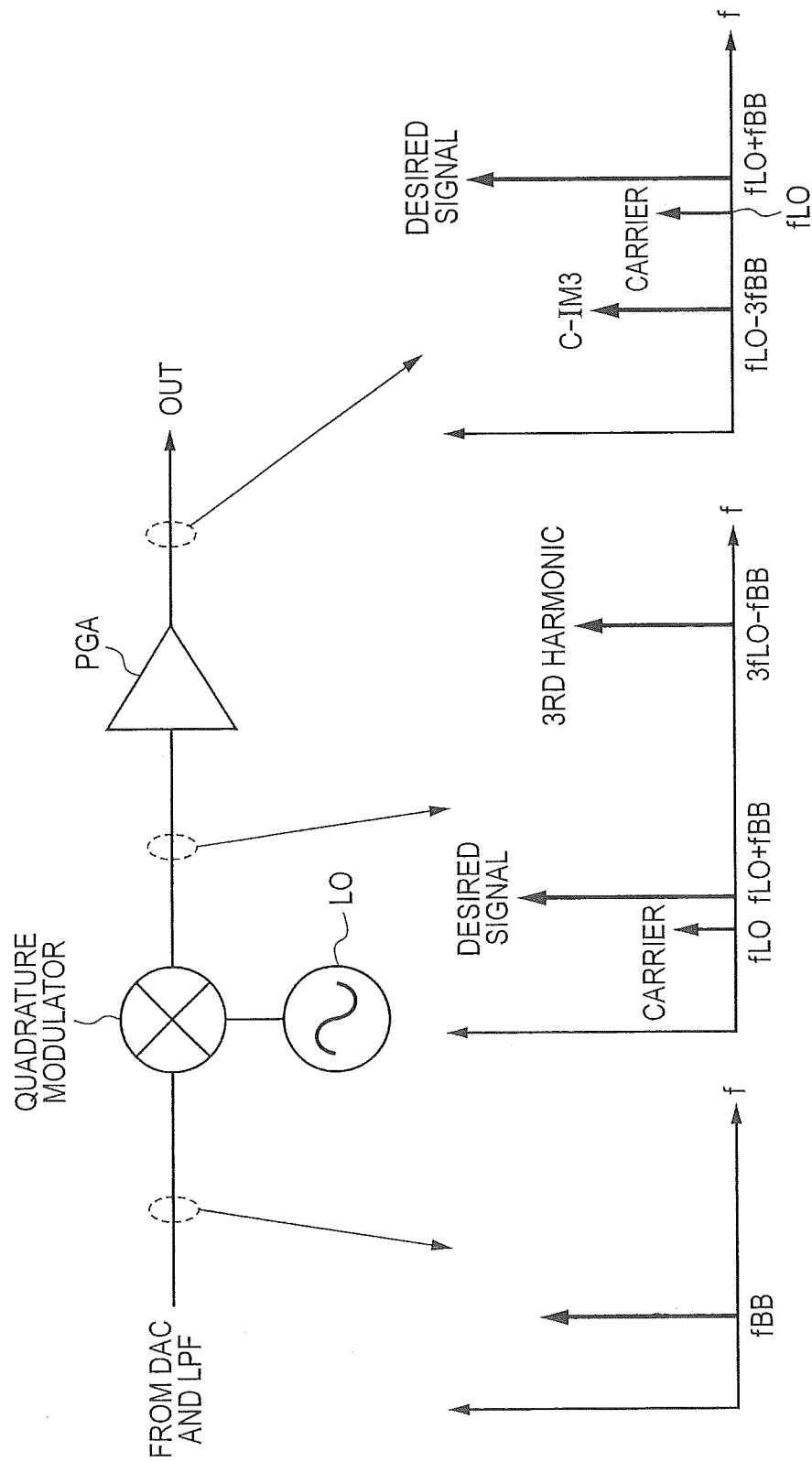
FIG. 2 is an explanatory drawing illustrating a generation mechanism of a C-IM3 in a transmitting unit TX.

FIG. 2 explains a generation mechanism of the C-IM3 in the transmitting unit TX. As illustrated in FIG. 2, the transmission baseband signal supplied via the DAC and the LPF is upconverted to the transmission RF signal by the quadrature modulator (QMOD) through the multiplication with the local oscillation signal (local carrier signal) generated by the LO. Assuming that a frequency of the transmission baseband signal (baseband frequency) is fBB and a frequency of the local oscillation signal (transmission carrier frequency) is fLO, a frequency of the desired signal to be transmitted of the transmission RF signals is expressed by fLO+fBB. The transmission RF signal further includes a third harmonic which is a threefold higher harmonic component (=3fLO−fBB) of the desired signal.

The transmission RF signal generated by the quadrature modulator is amplified by the PGA. An RF amplifier such as the PGA generally employs nonlinear elements, such as a transistor and a diode. When the transmission RF signal including the desired signal and the third harmonic is inputted into the PGA, the desired signal is naturally amplified, and at the same time, the so-called undesired signal (spurious) is generated in the output of the PGA, due to intermodulation between both of the inputted signals or between the inputted signals and a high frequency signal generated by the nonlinearity of the amplifier. The C-IM3 is an undesired signal generated by the intermodulation between the desired signal and the third harmonic, and the frequency thereof is expressed by fLO−3fBB. In this way, when the C-IM3 is generated near the frequency fLO+fBB of the desired signal, other communications will be interfered. In particular, the C-IM3 poses a serious problem in the LTE which has many bands of operation. As described above, the main cause of generation of the C-IM3 is the intermodulation between the desired signal and the third harmonic. Therefore, it is possible to reduce the C-IM3 by suppressing the third harmonic.

On the other hand, as for the multiband operation, the LTE prescribes more bands of operation and more operating frequencies than the W-CDMA. Specifically, in contrast to the fact that the W-CDMA prescribes 17 bands and the operating frequency of 1.2 GHz, the LTE prescribes 31 bands and the operating frequency of 2.2 GHz. Generally, the multiband operation of the transmitting unit TX is realized by providing plural circuit blocks each configured with a quadrature modulator, a PGA, and a transmission balun.

As described above, when plural circuit blocks are provided for the transmitting unit TX, the occupied area of the transmitting unit TX increases, leading to increase of the chip area of the RFIC 100. Therefore, when each of the circuit blocks, each configured with a quadrature modulator, a PGA, and a transmission balun, operates in a wide band, it is possible to reduce the chip area of the RFIC 100. For example, when it is assumed that three circuit blocks are mounted in the RFIC 100, the frequency band to be covered by each of the circuit blocks is set as 700-900 MHz, 1.4-2.0 GHz, and 2.3-2.6 GHz. The design of a quadrature modulator which supports the widest frequency band of 1.4-2.0 GHz is the most difficult among the three frequency bands.

As seen from the above description, in the transmitting unit TX of the RFIC 100 mounted in the wireless communication device supporting the LTE, it is required to develop the circuit technology for suppressing the third harmonic generated by the quadrature modulator over a wide band (1.4-2.0 GHz). As illustrated in FIG. 1, in the RFIC 100 according to Embodiment 1, a filter circuit 180 is provided between the QMOD 154 and the PGA 152. As explained in the following, the filter circuit 180 is configured so as to pass the desired signal of the transmission RF signal inputted and to attenuate the third harmonic.

Hereinafter, the configuration of the filter circuit applied to the RFIC 100 according to Embodiment 1 is explained in detail with reference to the drawings.

(A Configuration of an Ideal Filter Circuit)

In explaining the configuration of a filter circuit according to Embodiment 1, the configuration of an ideal filter circuit and issues involved in the filter circuit concerned will be explained first.

Figure 3A:
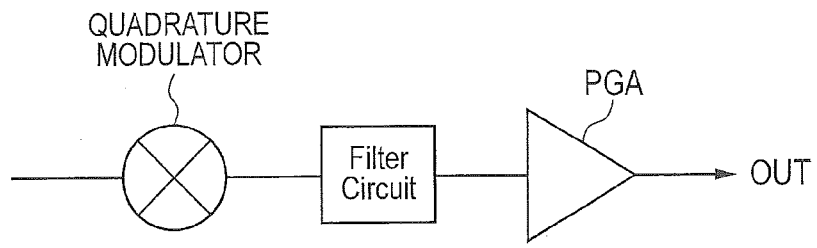
FIG. 3A is a circuit diagram illustrating arrangement of a filter circuit.
Figure 3B:
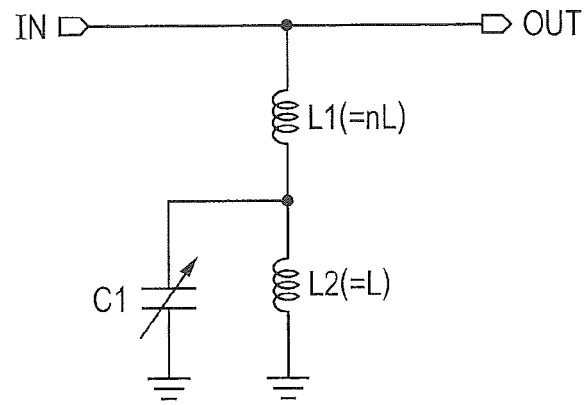
FIG. 3B is a circuit diagram illustrating a configuration of an ideal filter circuit.

FIG. 3A illustrates arrangement of a filter circuit and FIG. 3B is a circuit diagram illustrating the configuration of an ideal filter circuit. For convenience of explanation, the following illustrates a single-ended filter circuit.

As illustrated in FIG. 3A, a filter circuit is disposed between the quadrature modulator and the PGA. The filter circuit is configured with a notch filter. Specifically, as illustrated in FIG. 3B, the notch filter is provided with inductors L1 and L2 coupled in this order in series between a signal line which transmits a transmission RF signal and a power supply line which is supplied with a ground potential (hereinafter called a grounding line), and a variable capacitor C1 coupled between a coupling node of the inductors L1 and L2 and the grounding line.

Figure 4:
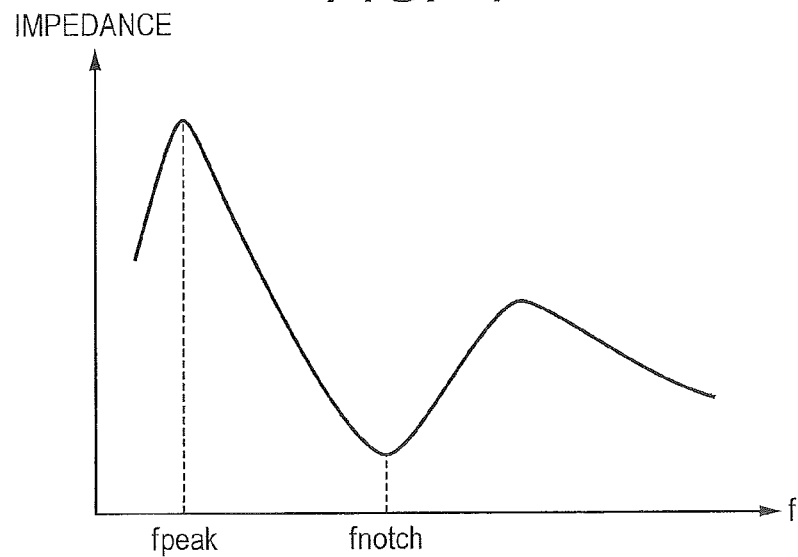
FIG. 4 is a drawing illustrating a frequency characteristic of an input impedance of a notch filter illustrated in FIG. 3B.

FIG. 4 illustrates a frequency characteristic of an input impedance of the notch filter illustrated in FIG. 3B. The notch filter acts as high impedance when the parallel circuit of the inductor L2 and the variable capacitor C1 resonates, and acts as low impedance when the inductors 11 and L2 and the variable capacitor C1 resonate. In the following explanation, the resonance frequency when the notch filter becomes high impedance is expressed as "a peak frequency fpeak", and the resonance frequency when the notch filter becomes low impedance is expressed as "a notch frequency fnotch".

When it is assumed that the inductance of the inductor L2 is L, the inductance of the inductor L1 is n times of the inductance of the inductor L2 (=nL), and the capacitance of the variable capacitor C1 is C1, then the peak frequency fpeak and the notch frequency fnotch of the notch filter are given by Equations (1) and (2), respectively.

[Mathematical 1]

$$\omega_{peak} = \frac{1}{\sqrt{LC_1}} \qquad (1)$$

$$\omega_{notch} = \sqrt{\frac{n+1}{nLC_1}} \qquad (2)$$

When it is assumed that a ratio of the peak frequency fpeak and the notch frequency fnotch (hereinafter also called "a frequency ratio") in the notch filter is fr, then the frequency ratio fr is expressed by Equation (3) using Equations (1) and (2).

[Mathematical 2]

$$fr = \frac{\omega_{notch}}{\omega_{peak}} = \sqrt{\frac{n+1}{n}} \qquad (3)$$

As clarified by Equation (3), the frequency ratio of the notch filter is given by a function of only the inductance ratio n of the inductors L1 and L2. The third harmonic has about 3 times the frequency of the desired signal among the transmission RF signal inputted into the notch filter from the quadrature modulator. Therefore, by setting the frequency ratio of the notch filter to 3, it is possible for the notch filter to suppress the third harmonic, without attenuating the desired signal. In order to set the frequency ratio to 3, it is only necessary to set the inductance ratio n as n=⅛.

Here, as shown by Equation (1), the peak frequency fpeak of the notch filter changes corresponding to the capacitance of the variable capacitor C1. Therefore, by changing the capacitance of the variable capacitor C1, it is possible to change the peak frequency fpeak and the notch frequency fnotch, maintaining the frequency ratio given by Equation (3).

Figure 5:
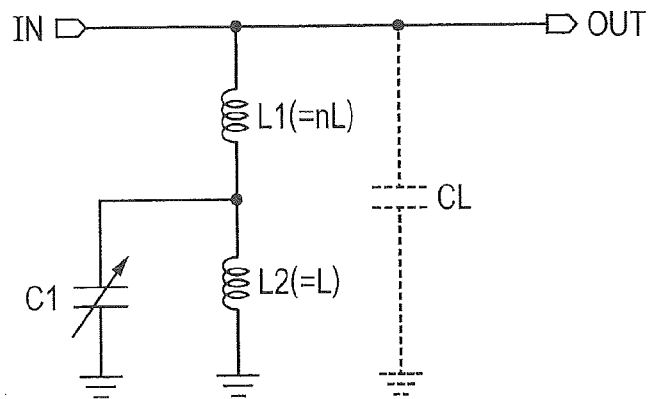
FIG. 5 is an explanatory drawing illustrating an issue of the notch filter illustrated in FIG. 3B.

However, in the notch filter illustrated in FIG. 3B, a parasitic capacitance CL actually exists in the signal line as illustrated in FIG. 5. Under the influence of the parasitic capacitance CL of the signal line, the frequency characteristic of the notch filter deviates from the characteristic illustrated in FIG. 4. Specifically, when the parasitic capacitance CL of the signal line is taken into consideration, the peak frequency fpeak and the notch frequency fnotch of the notch filter are given by Equation (4) and Equation (5), respectively.

[Mathematical 3]

$$\omega_{peak} \approx \frac{1}{\sqrt{L\{C_1 + (n+1)C_L\}}} \qquad (4)$$

$$\omega_{notch} = \sqrt{\frac{n+1}{nLC_1}} \qquad (5)$$

When Equations (4) and (5) are compared with Equations (1) and (2), respectively, the notch frequency (notch coincides but the peak frequency fpeak differs between the actual notch filter and the ideal notch filter. In general, the parasitic capacitance CL of the signal line has a sufficiently large capacitance as compared with the variable capacitor C1 (CL>>C1), therefore, the peak frequency fpeak is substantially decided by the parasitic capacitance CL. That is, when the parasitic capacitance CL of the signal line exists, even if the capacitance of the variable capacitor C1 is changed, the peak frequency fpeak hardly changes. Therefore, the frequency ratio of the actual notch filter will deviate from 3 greatly. As a result, the notch filter illustrated in FIG. 3B cannot suppress the third harmonic generated by the quadrature modulator, over a wide band.

As explained in detail in the following, the filter circuit according to Embodiment 1 has a circuit configuration in which the influence of the parasitic capacitance CL of the signal line is considered, thereby realizing the frequency ratio of 3 over a wide band.

(A Configuration of the Filter Circuit According to Embodiment 1)

Figure 6:
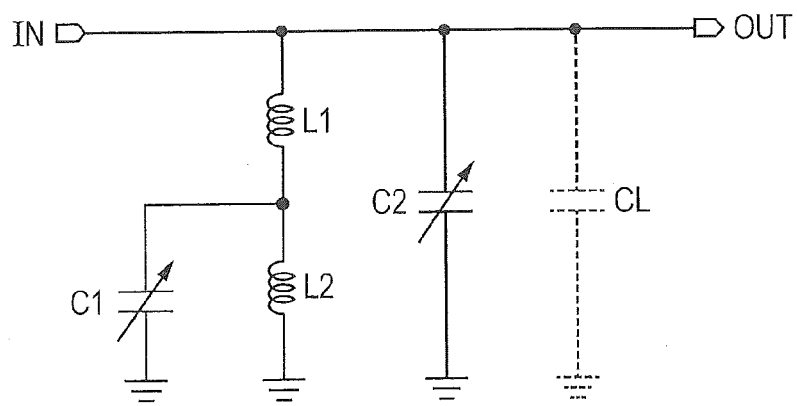
FIG. 6 is a circuit diagram illustrating a configuration of a single-ended filter circuit according to Embodiment 1.

Hereinafter, the configuration of the filter circuit according to Embodiment 1 is explained. FIG. 6 is a circuit diagram illustrating the configuration of the filter circuit according to Embodiment 1. FIG. 6 illustrates a single-ended filter circuit.

As illustrated in FIG. 6, the filter circuit according to Embodiment 1 is equivalent to the ideal notch filter illustrated in FIG. 3B to which a variable capacitor C2 is further provided. The variable capacitor C2 is coupled between the signal line and the grounding line. That is, the variable capacitor C2 is coupled in parallel with the parasitic capacitance CL of the signal line, with respect to the signal line.

In the notch filter illustrated in FIG. 6, when it is assumed that the inductance of the inductor L2 is L, the inductance of the inductor L1 is n times the inductance of the inductor L2 (=nL), the capacitance of the variable capacitor C1 is C1, and the capacitance of the variable capacitor C2 is C2, then, the peak frequency fpeak and the notch frequency fnotch are given by Equations (6) and (7), respectively.

[Mathematical 4]

$$\omega_{peak} \approx \frac{1}{\sqrt{L\{C_1 + (n+1)(C_2 + C_L)\}}} \quad (6)$$

$$\omega_{notch} = \sqrt{\frac{n+1}{nLC_1}} \quad (7)$$

The peak frequency fpeak changes corresponding to the capacitance C1 of the variable capacitor C1 and the capacitance C2 of the variable capacitor C2. The notch frequency fnotch changes corresponding to the capacitance C1 of the variable capacitor C1. It is possible to adjust the peak frequency fpeak and the notch frequency fnotch mutually independently, with the use of these two variable capacitors C1 and C2.

Next, with reference to FIG. 7 to FIG. 12, an example of the configuration of the differential filter circuit mounted in the RFIC 100 (FIG. 1) is explained.

Figure 7:
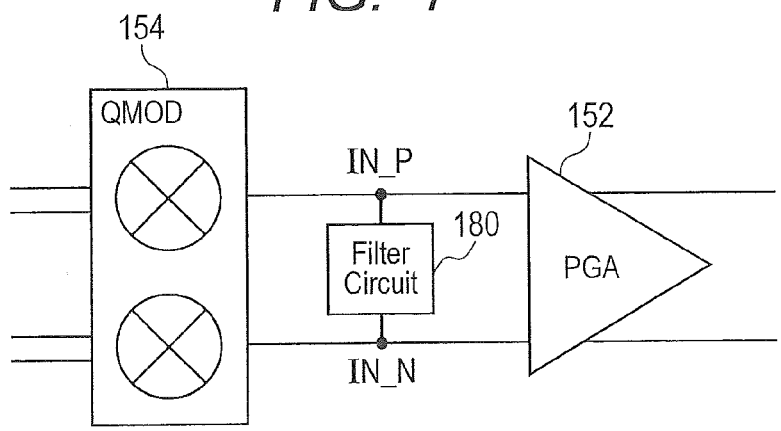
FIG. 7 is a circuit diagram illustrating a configuration of a differential filter circuit according to Embodiment 1.

As illustrated in FIG. 7, a filter circuit 180 according to Embodiment 1 is disposed between the QMOD 154 and the PGA 152. The filter circuit 180 is configured with a notch filter. The filter circuit 180 is provided with a pair of input terminals IN_P and IN_N. The plus-side input terminal IN_P receives a plus-side signal of the transmission RF signal as the differential signal, and the negative-side input terminal IN_N receives a negative-side signal of the transmission RF signal.

Figure 8:
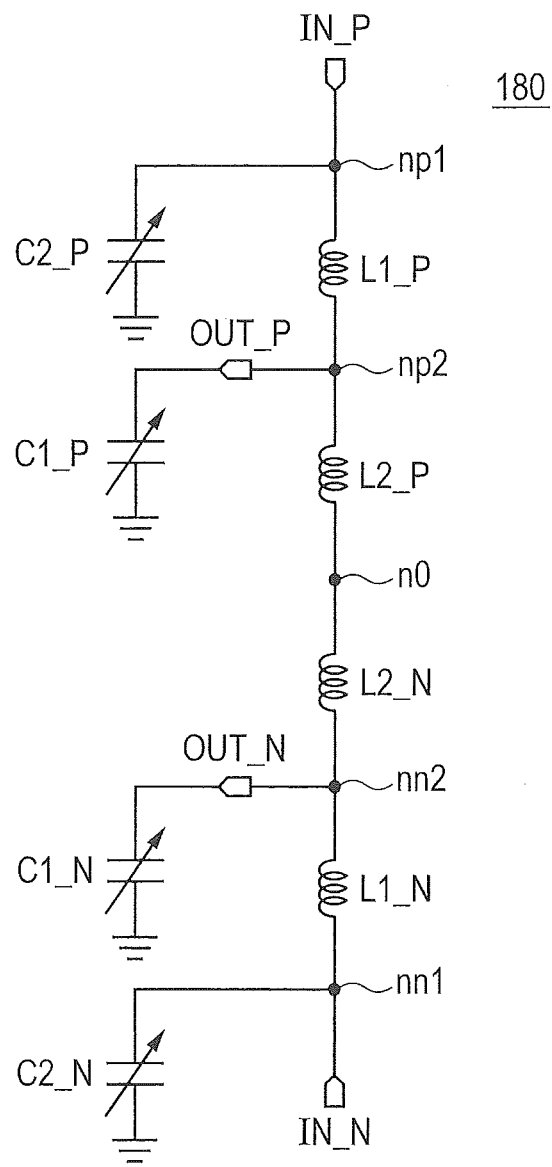
FIG. 8 is a circuit diagram illustrating an example of the configuration of the filter circuit illustrated in FIG. 7.

FIG. 8 is a circuit diagram illustrating an example of the configuration of the filter circuit 180 illustrated in FIG. 7. As illustrated in FIG. 8, the filter circuit 180 is configured with four inductors L1_P, L2_P, L2_N, and L1_N, and four variable capacitors C1_P, C2_P, C1_N and C2_N.

The four inductors L1_P, L2_P, L2_N, and L1_N are coupled in this order in series between the input terminal IN_P and the input terminal IN_N. As described later, the inductors L1_P and L1_N are coupled differentially to configure a differential inductor. Similarly, the inductors L2_P and L2_N also configure a differential inductor. A midpoint n0 of the four inductors (a coupling node of the inductors L2_P and L2_N) is grounded in the sense of high frequency (in the sense of alternating current).

The variable capacitor C2_P is coupled from a coupling node np1 of the plus-side input terminal IN_P and the inductor L1_P to a grounding line. The variable capacitor C2_N is coupled from a coupling node nn1 of the negative-side input terminal IN_N and the inductor L1_N to the grounding line. Here, coupling to the grounding line means being grounded in the sense of direct current as well as in the sense of alternating current.

A coupling node np2 of the inductors L1_P and L2_P is coupled to a plus-side output terminal OUT_P. The variable capacitor C1_P is coupled between the plus-side output terminal OUT_P and the grounding line.

A coupling node nn2 of the inductors L1_N and L2_N is coupled to a negative-side output terminal OUT_N. The variable capacitor C1_N is coupled between the negative-side output terminal OUT_N and the grounding line.

By adopting such a configuration, the plus-side signal of the differential signal inputted into the filter circuit 180 is inputted into the notch filter which is configured with the inductors L1_P and L2_P and the variable capacitors C1_P and C2_P. On the other hand, the negative-side signal of the differential signal inputted into the filter circuit 180 is inputted into the notch filter which is configured with the inductors L1_N and L2_N and the variable capacitors C1_N and C2_N. The peak frequency fpeak and the notch frequency fnotch of each notch filter can be independently adjusted with the use of two corresponding variable capacitors C1 and C2, as illustrated in FIG. 6.

Figure 9:
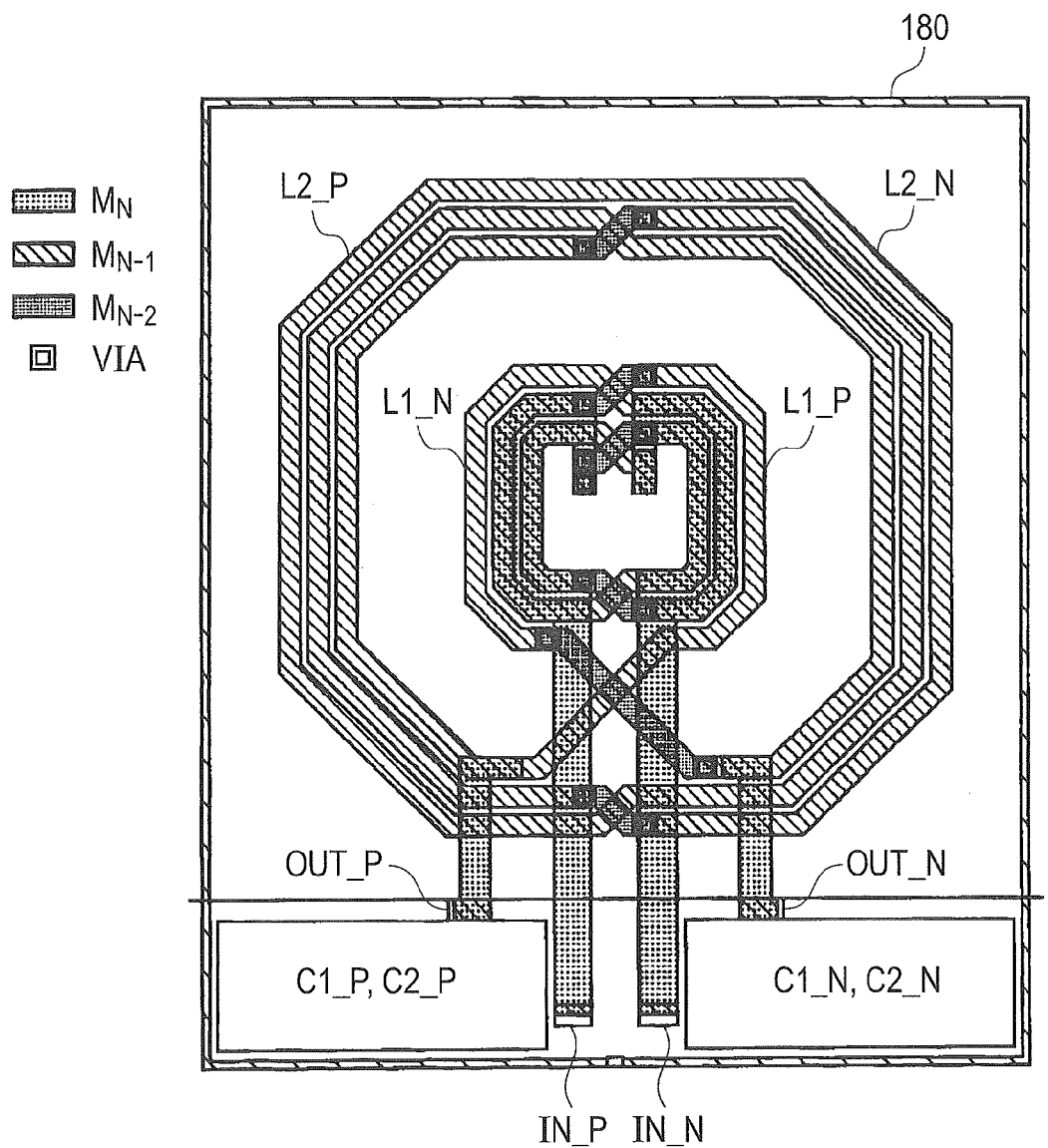
FIG. 9 is a plan view illustrating an example of the configuration of the filter circuit illustrated in FIG. 8.

FIG. 9 is a plan view illustrating an example of the configuration of the filter circuit 180 illustrated in FIG. 8. As illustrated in FIG. 9, four inductors L1_P, L2_P, L1_N, and L2_N are formed using a metallic wiring MN-1 of small resistivity. An intersecting portion of the inductor L2_P and the inductor L2_N and an intersecting portion of the inductor L1_P and the inductor L1_N are formed using a lower layer metallic wiring MN-2 arranged lower than the metallic wiring MN-1. The metallic wiring MN-1 and the metallic wiring MN-2 are coupled by means of a contact VIA.

A top layer metallic wiring MN arranged higher than the metallic wiring MN-1 is employed for coupling between the plus-side input terminal IN_P and the inductor L1_P, coupling of the inductor L1_P and the inductor L2_P with the plus-side output terminal OUT_P, coupling between the negative-side input terminal IN_N and the inductor L1_N, and coupling of the inductor L1_N and the inductor L2_N with the negative-side output terminal OUT_N.

Figure 10A:
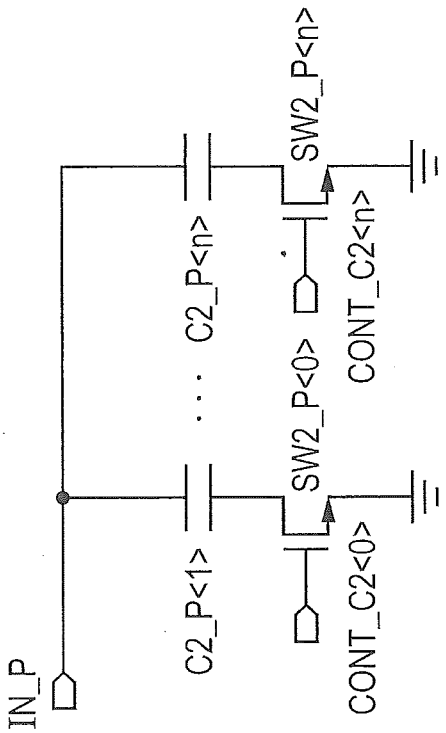
FIG. 10A is a circuit diagram illustrating an example of a configuration of a variable capacitor employed for the filter circuit of FIG. 9.
Figure 10B:
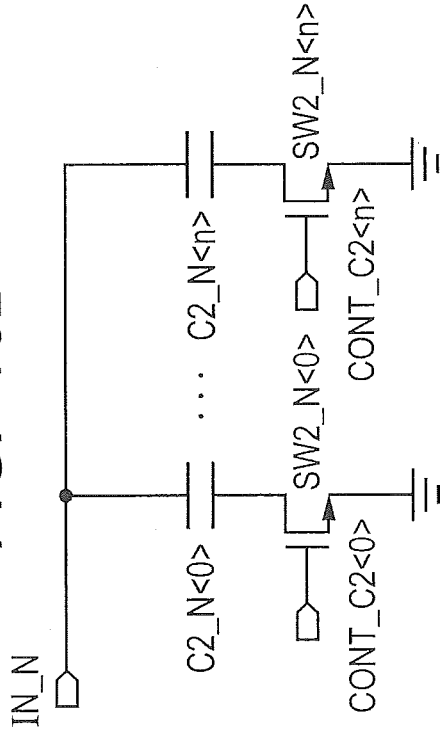
FIG. 10B is a circuit diagram illustrating an example of a configuration of another variable capacitor employed for the filter circuit of FIG. 9.
Figure 10C:
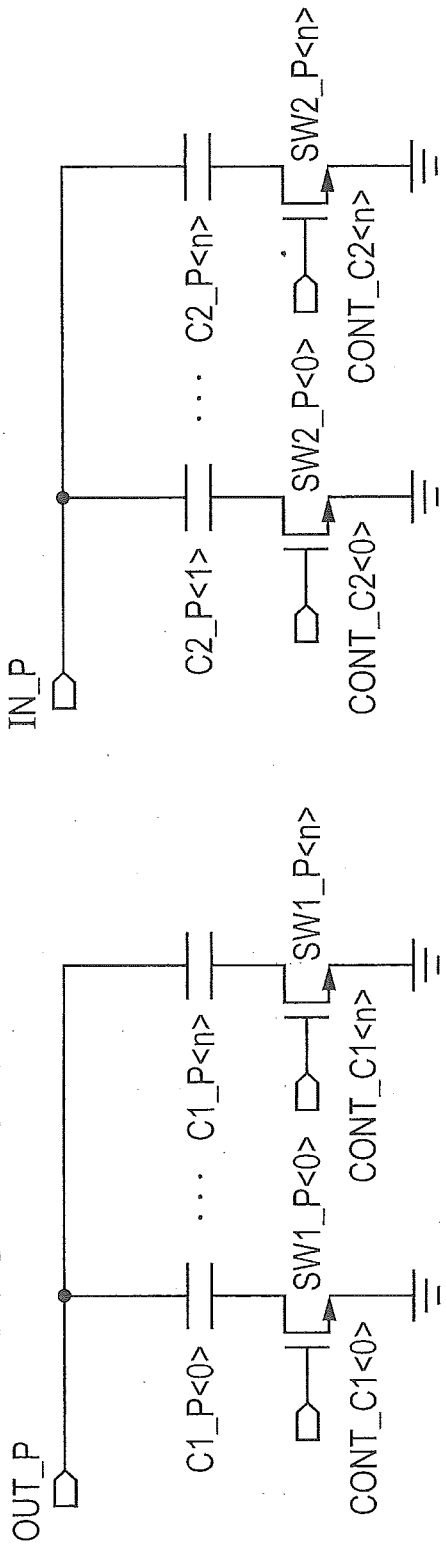
FIG. 10C is a circuit diagram illustrating an example of a configuration of a further another variable capacitor employed for the filter circuit of FIG. 9.
Figure 10D:
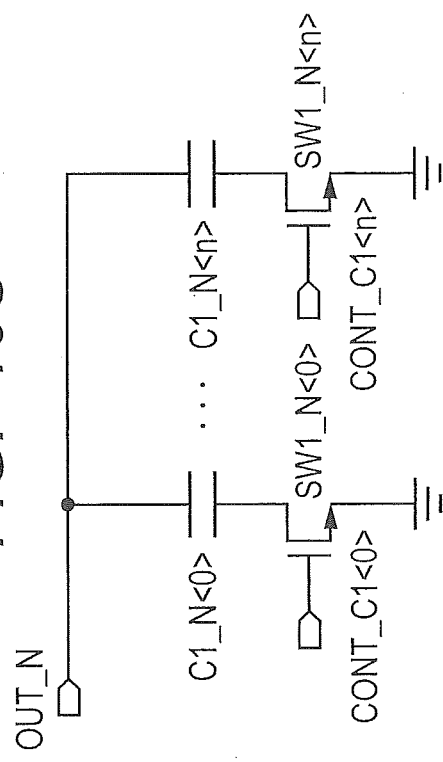
FIG. 10D is a circuit diagram illustrating an example of a configuration of a yet another variable capacitor employed for the filter circuit of FIG. 9.

FIGS. 10A, 10B, 10C, and 10D are circuit diagrams respectively illustrating an example of the configuration of the variable capacitors employed for the filter circuit illustrated in FIG. 9. FIG. 10A is a circuit diagram of the variable capacitor C1_P, FIG. 10B is a circuit diagram of the variable capacitor C2_P, FIG. 10C is a circuit diagram of the variable capacitor C1_N, and FIG. 10D is a circuit diagram of the variable capacitor C2_N.

As illustrated in FIG. 10A, the variable capacitor C1_P includes n+1 capacitive elements (n is a natural number) C1_P<0> to C1_P<n> and n+1 switching elements SW1_P<0> to SW1_P<n>. The capacitive element adopts, as an example, the so-called MIM (Metal Insulator Metal) capacitor which uses a metal layer formed in the same layer as the metallic wiring as an electrode of the capacitor. The switching elements SW1_P<0> to SW1_P<n> adopt, as an example, a MOS (Metal Oxide Semiconductor) transistor.

The switching elements SW1_P<0> to SW1_P<n> are coupled in series to the capacitive elements C1_P<0> to C1_P<n>, respectively. The series circuits each configured with the capacitive element C1_P<i> and the switching element SW1_P<i> (i is zero or a positive integer not exceeding n) are coupled in parallel with each other between the plus-side output terminal OUT_P and the grounding line.

The switching elements SW1_P<0> to SW1_P<n> are respectively turned on (conductive) or turned off (non-conductive) in response to control signals CONT_C1<n:0> (=CONT_C1<0> to CONT_C1<n>). In this way, it is possible to adjust the number of the capacitive elements coupled in parallel with each other between the plus-side output terminal OUT_P and the grounding line, by the control signals CONT_C1<n:0>. Therefore, it is possible to adjust the total capacitance C1 of the variable capacitors C1_P by the control signal CONT_C1<n:0>.

The variable capacitor C2_P illustrated in FIG. 10B is similarly configured as the variable capacitor C1_P illustrated in FIG. 10A, and it is possible to adjust the total capacitance C2 of the variable capacitors C2_P by the control signals CONT_C2<n:0>(=CONT_C2<0> to CONT_C2<n>).

The variable capacitor C1_N illustrated in FIG. 10C is similarly configured as the variable capacitor C1_P illustrated in FIG. 10A, and it is possible to adjust the total capacitance C1 of the variable capacitors C1_N by the control signals CONT_C1<n:0>.

The variable capacitor C2_N illustrated in FIG. 10D is similarly configured as the variable capacitor C2_P illustrated in FIG. 10B, and it is possible to adjust the total capacitance C2 of the variable capacitors C2_N by the control signals CONT_C2<n:0>.

Figure 11:
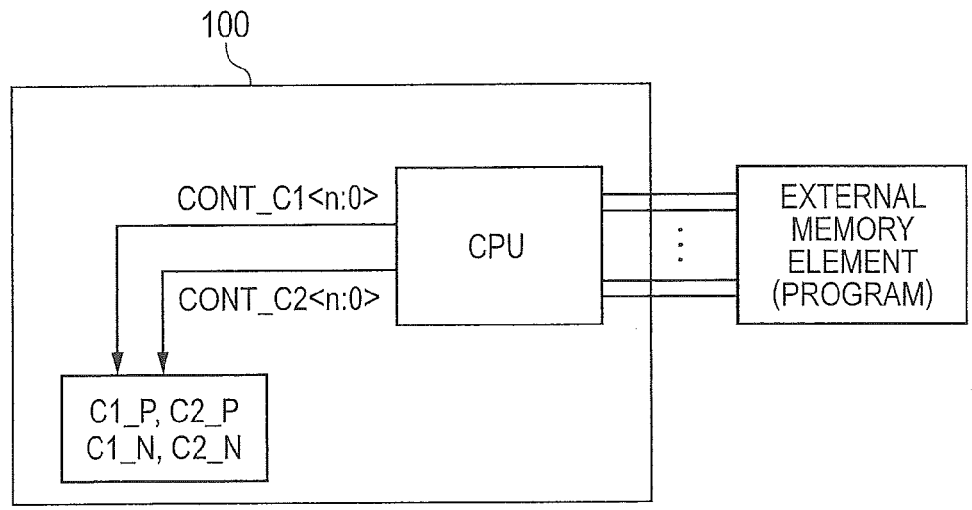
FIG. 11 is an explanatory drawing for illustrating adjustment of a capacitance value of a variable capacitor.

The RFIC 100 is provided with a central processing unit (CPU), as illustrated in FIG. 11. The control signals CONT_C1<n:0> and CONT_C2<n:0> illustrated in FIG. 10A and FIG. 10B, respectively, are transmitted from the CPU. Specifically, the CPU can generate the control signals CONT_C1<n:0> and CONT_C2<n:0> by reading and executing a program stored in advance in an external memory element (configured with a nonvolatile memory) provided in the exterior of the RFIC 100. The CPU performs control necessary for the transmitting operation and receiving operation of the RFIC 100, including an initial setting in the RFIC 100 at the time of activation. The control signals CONT_C1<n:0> and CONT_C2<n:0> are generated as a part of the processing in the initial setting.

As described above, in the filter circuit 180 illustrated in FIG. 8, the capacitance C1 of the variable capacitors C1_P and C1_N is adjusted by the control signal CONT_C1<n:0> supplied from the CPU, and the capacitance C2 of the variable capacitors C2_P and C2_N is adjusted by the control signal CONT_C2<n:0> supplied from the CPU.

Before the product shipment of the RFIC 100 (FIG. 1), the frequency characteristic of the filter circuit 180 is tuned up by a tuning circuit (not shown). The tuning is performed to each of plural bands of operation which are supported by the wireless communication device mounting the RFIC 100. For every band of operation, the capacitance of the variable capacitors C1 and C2 is determined so as to set the frequency ratio of the peak frequency fpeak and the notch frequency fnotch to 3.

Figure 12:
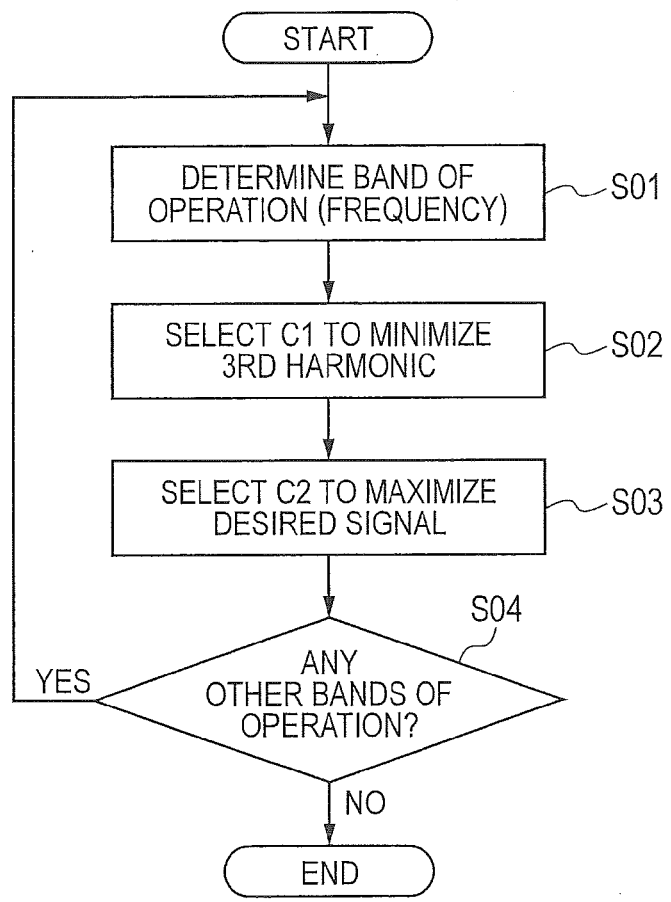
FIG. 12 is a flow chart illustrating a tuning operation of the frequency characteristic of the filter circuit illustrated in FIG. 8.

FIG. 12 is a flow chart illustrating a tuning operation of the frequency characteristic of the filter circuit 180 illustrated in FIG. 8.

As illustrated in FIG. 12, at Step S01, the band of operation to tune up the frequency characteristic and the frequency of the desired signal in the band of operation concerned are determined. A frequency of 3 times the frequency of the desired signal determined corresponds to the frequency of the third harmonic.

Then, a transmission RF signal corresponding to the desired signal determined is generated and inputted into the filter circuit 180. On the basis of the transmission RF signal passing through the filter circuit 180, the capacitance of the variable capacitors C1 and C2 is adjusted.

Specifically, at first at Step S02, the capacitance of the variable capacitor C1 is selected so as to minimize the magnitude of the third harmonic included in the transmission RF signal. Next, corresponding to the selected capacitance of the variable capacitor C1, the capacitance of the variable capacitor C2 is selected so as to maximize the magnitude of the desired signal included in the transmission RF signal.

When the capacitance of the variable capacitors C1 and C2 has been selected, the flow advances to Step S04 and it is determined whether there exists another band of operation to be tuned up. When there exists another band of operation to be tuned up (YES at Step S04), the processing at Steps S01 to S03 is performed to the band of operation, and the capacitance of the variable capacitors C1 and C2 is selected. When tuning has been performed to all the bands of operation (NO at Step S04), the flow is terminated.

As described above, for every band of operation, the capacitance of the variable capacitors C1 and C2 is selected so as to set the frequency ratio to 3. The selected capacitance of the variable capacitors C1 and C2 is associated with the band of operation, and the value which specifies the capacitance value is stored in the external memory element (FIG. 11) as a program. The CPU generates the control signals CONT_C1<n:0> and CONT_C2<n:0> when the RFIC 100 is activated, by retrieving the value corresponding to the band of operation to be employed from the external memory element (nonvolatile memory) to the predetermined register in the RFIC 100.

In this way, in the use stage after the product shipment, the CPU reads the program corresponding to the band of operation to be employed from the external memory element, and on the basis of the capacitance specified by the read program, the CPU generates the control signals CONT_C1<n:0> and CONT_C2<n:0>. In response to the generated control signals, the switching elements SW0 to SWn are turned on and off; accordingly, the capacitance of the variable capacitors C1 and C2 is adjusted to the optimal value for realizing the frequency ratio of 3 in the band of operation.

Operation-Effect of Embodiment 1

Figure 13:
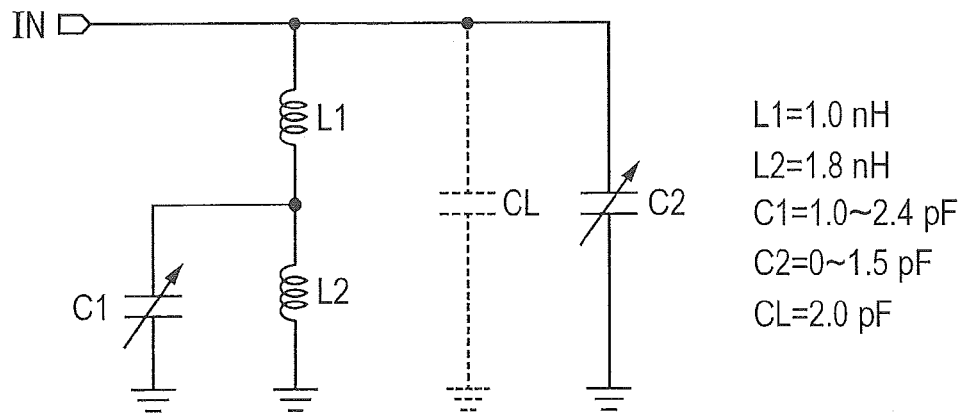
FIG. 13 is a drawing illustrating a simulation condition for analyzing the frequency characteristic of the filter circuit according to Embodiment 1.
Figure 14:
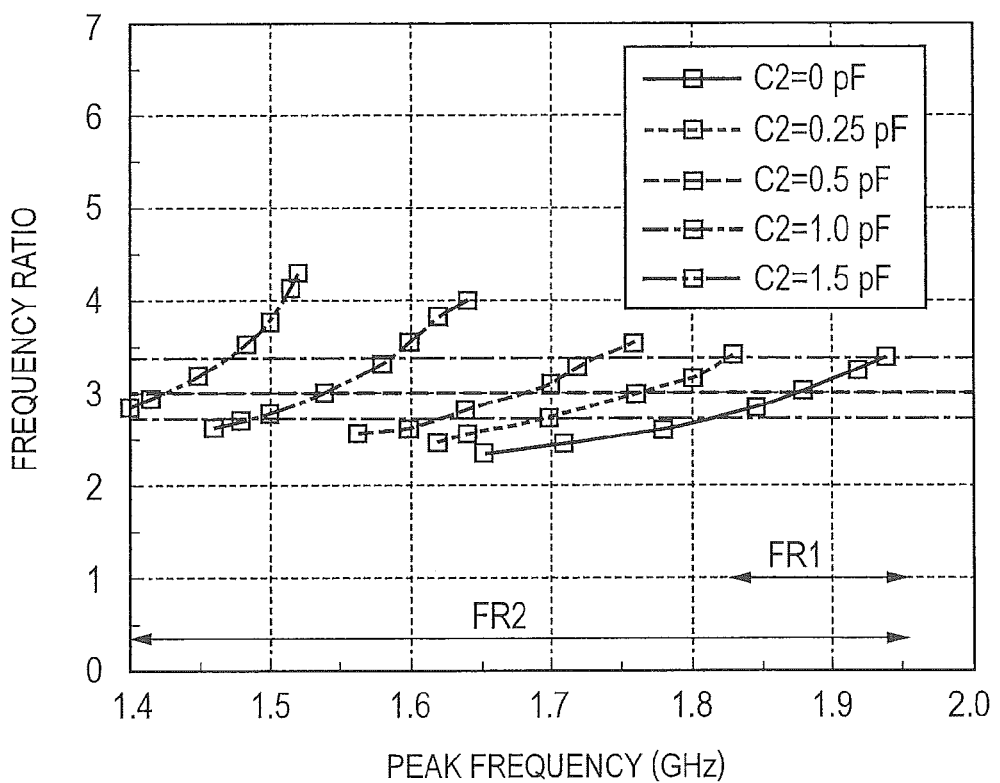
FIG. 14 is a drawing illustrating a simulation result of a relation between a frequency ratio and a peak frequency of the filter circuit.
Figure 15:
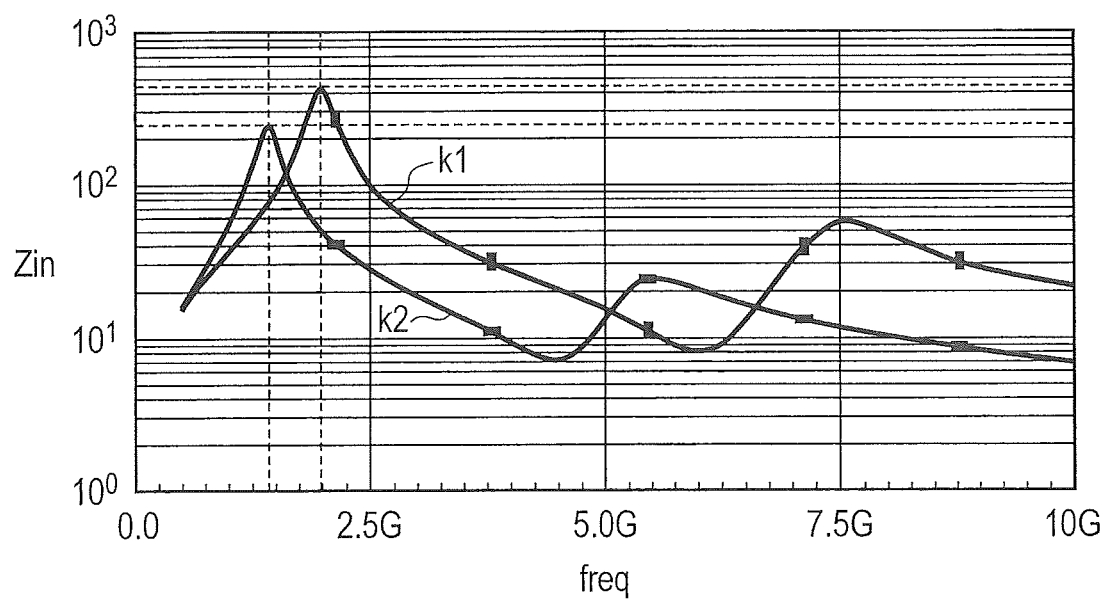
FIG. 15 is a drawing illustrating a simulation result of input impedance of the filter circuit by an electromagnetic field simulator.

With reference to FIG. 13 to FIG. 15, the following explains the result of simulation analysis on the frequency characteristic of the filter circuit according to Embodiment 1.

FIG. 13 illustrates a simulation condition. The simulation of the frequency characteristic of the filter circuit has been performed changing the capacitance of the variable capacitors C1 and C2, respectively. FIG. 14 illustrates the simulation result of a relation between the frequency ratio and the peak frequency fpeak of the filter circuit. In the figure, changes of the peak frequency fpeak and the frequency ratio are shown when the capacitance of the variable capacitor C1 is changed, with the capacitance of the variable capacitor C2 as a parameter. The acceptable range of the frequency ratio (assuming 3±10% for example) is also shown in the figure.

As illustrated in FIG. 14, when the capacitance of the variable capacitor C2 is 0 pF (that is, when the variable capacitor C2 is not provided), the frequency range of the peak frequency fpeak with the frequency ratio kept in the acceptable range is 1.82 GHz to 1.95 GHz (corresponding to the range FR1 in the figure). When the capacitance of the variable capacitor C2 is increased gradually, the frequency range of the peak frequency fpeak shifts to the low frequency side. When the capacitance of the variable capacitor C2 is increased up to 1.5 pF, the frequency range of the peak frequency fpeak covers 1.4 GHz to 1.95 GHz, expanding by about 4 times the frequency range when the variable capacitor C2 is not provided. In this way, by changing the capacitance of the variable capacitor C2, it is possible to maintain the frequency ratio in the acceptable range over the broad frequency range.

FIG. 15 illustrates a simulation result of input impedance Zin of the filter circuit 180 by an electromagnetic field simulator. With the use of the electromagnetic field simulator, modeling has been performed by conducting electromagnetic field analysis of the differential inductor illustrated in FIG. 9. In the present modeling, the capacitance of the variable capacitors C1 and C2 is changed.

A solid line k1 in FIG. 15 shows a simulation result of the input impedance Zin when the variable capacitors C1 and C2 are assumed to be 1.8 pF and 0 pF, respectively. A solid line k2 shows a simulation result of the input impedance Zin when the variable capacitors C1 and C2 are assumed to be 3.2 pF and 2.3 pF, respectively. It is seen from the figure that by changing the capacitance of the variable capacitors C1 and C2, the peak frequency fpeak and the notch frequency fnotch can be changed with the frequency ratio of 3 maintained.

In this way, according to the filter circuit according to Embodiment 1, it is possible to adjust the peak frequency and the notch frequency independently with the use of two variable capacitors C1 and C2 included in the notch filter; accordingly, it is possible to realize the frequency ratio of 3 over the wide band. Therefore, it is possible to employ the filter circuit according to Embodiment 1 appropriately for the RFIC supporting the LTE in which the low distortion property and the multiband operation are required.

Embodiment 2

Figure 16:
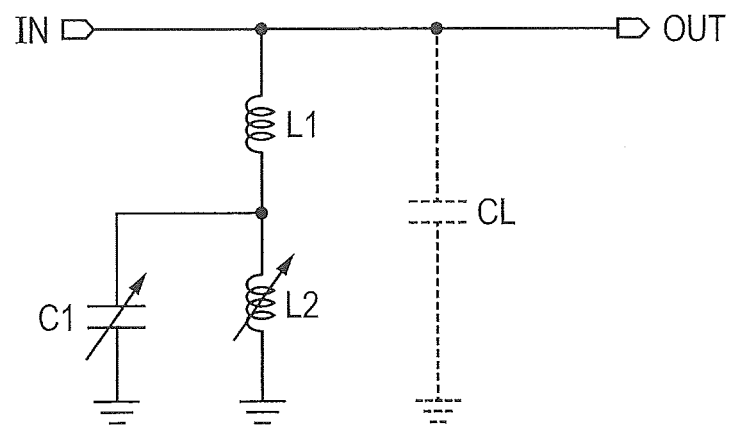
FIG. 16 is a circuit diagram illustrating a configuration of a single-ended filter circuit according to Embodiment 2.

FIG. 16 is a circuit diagram illustrating a configuration of a filter circuit according to Embodiment 2. FIG. 16 illustrates a single-ended filter circuit.

As illustrated in FIG. 16, The filter circuit according to Embodiment 2 is equivalent to the ideal notch filter illustrated in FIG. 3B in which the inductor L2 is replaced with a variable inductor. In the following explanation, the inductor L2 is expressed as a variable inductor L2.

In the notch filter illustrated in FIG. 16, when it is assumed that the inductance of the variable inductor L2 is L2, the inductance of the inductor L1 is L1, the capacitance of the variable capacitor C1 is C1, the parasitic capacitance of the signal line is CL, then the peak frequency fpeak and the notch frequency fnotch are given by Equations (8) and (9), respectively.

[Mathematical 5]

$$\omega_{peak} \approx \frac{1}{\sqrt{L_1 C_1 + L_2(C_1 + C_L)}} \quad (8)$$

$$\omega_{notch} = \sqrt{\frac{L_1 + L_2}{L_1 L_2 C_1}} \quad (9)$$

The peak frequency fpeak changes depending on the capacitance C1 of the variable capacitor C1 and the inductance L2 of the variable inductor L2. The notch frequency fnotch changes depending on the capacitance C1 of the variable capacitor C1 and the inductance L2 of the variable inductor L2. In contrast to the filter circuit 180 according to Embodiment 1, both of the peak frequency fpeak and the notch frequency fnotch are dependent on the capacitance of the variable capacitor C1 and the inductance of the variable inductor L2. However, generally, the parasitic capacitance CL of a signal line is sufficiently large as compared with the capacitance of the variable capacitor C1 (CL>>C1); accordingly, the capacitance of the variable capacitor C1 influences little to the peak frequency fpeak. Therefore, the peak frequency fpeak is substantially decided by the inductance of the variable inductor L2. Based on the above discussion, it is possible to adjust the peak frequency fpeak and the notch frequency fnotch independently with each other, with the use of the variable capacitor C1 and the variable inductor L2.

Figure 17:
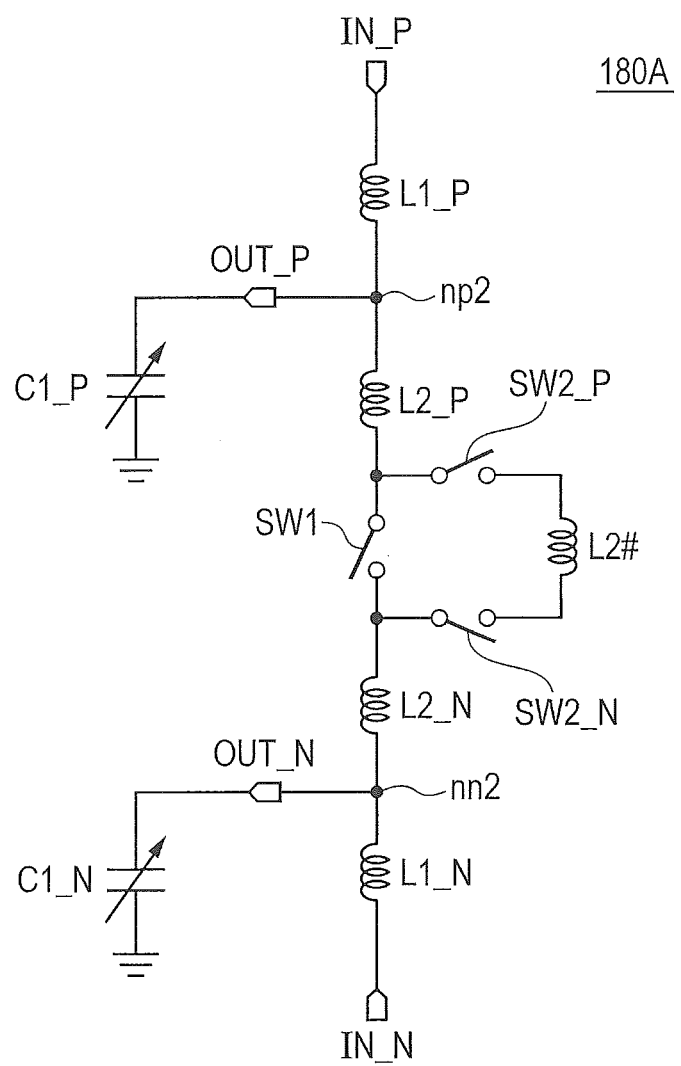
FIG. 17 is a circuit diagram illustrating an example of a configuration of a differential filter circuit according to Embodiment 2.
Figure 18:
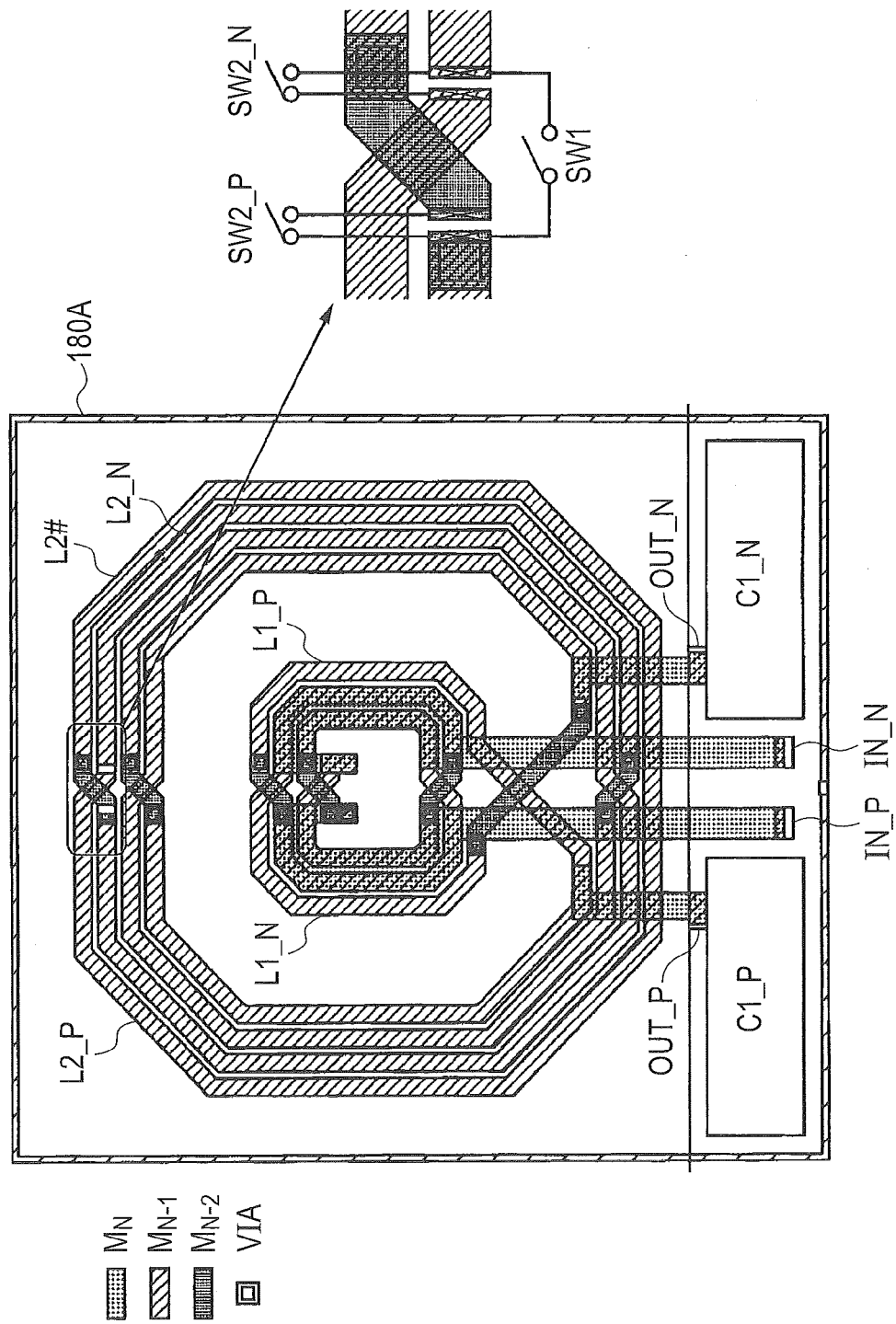
FIG. 18 is a plan view illustrating an example of the configuration of the filter circuit illustrated in FIG. 17.
Figure 19:
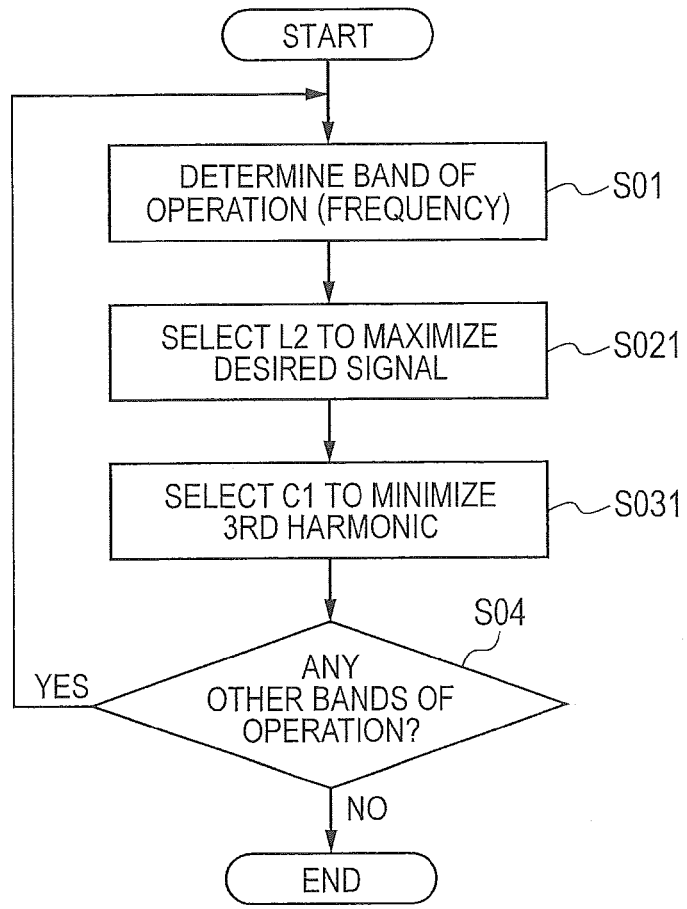
FIG. 19 is a flow chart illustrating a tuning operation of the frequency characteristic of the filter circuit illustrated in FIG. 17.

Next, with reference to FIG. 17 to FIG. 19, an example of the configuration of the differential filter circuit mounted in the RFIC 100 (FIG. 1) is explained.

FIG. 17 is a circuit diagram illustrating an example of the configuration of a filter circuit 180A according to Embodiment 2. The filter circuit 180A according to Embodiment 2 is disposed between the QMOD 154 and the PGA 152, as is the case with the filter circuit 180 illustrated in FIG. 1. The filter circuit 180A is configured with a notch filter. Among a pair of input terminals IN_P and IN_N of the filter circuit 180A, the plus-side input terminal IN_P receives the plus-side signal of the transmission RF signal as the differential signal, and the negative-side input terminal IN_N receives the negative-side signal of the transmission RF signal.

As illustrated in FIG. 17, the filter circuit 180A includes four inductors L1_P, L2_P, L2_N, and L1_N, and two variable capacitors C1_P and C1_N. The filter circuit 180A further includes an inductor L2# and switches SW1, SW2_P, and SW2_N.

The four inductors L1_P, L2_P, L2_N, and L1_N are coupled in this order in series between the input terminal IN_P and the input terminal IN_N. The inductors L1_P and L1_N are coupled differentially to configure a differential inductor. Similarly, the inductors L2_P and L2_N also configure a differential inductor.

A coupling node np2 of the inductors L1_P and L2_P is coupled to a plus-side output terminal OUT_P. The variable capacitor C1_P is coupled between the plus-side output terminal OUT_P and the grounding line.

The coupling node nn2 of the inductors L1_N and L2_N is coupled to a negative-side output terminal OUT_N. The variable capacitor C1_N is coupled between the negative-side output terminal OUT_N and the grounding line.

The switch SW1 is coupled between the inductor L2_P and the inductor L2_N. The switch SW2_P, the inductor L2#, and the switch SW2_N are coupled in this order in series between the inductor L2_P and the inductor L2_N. In response to a control signal CONT_L2 supplied by the CPU (FIG. 11), the switch SW1 and two of the switches SW2_P and SW2_N are turned on and off complementarily. Specifically, when the switch SW1 is turned on and the switches SW2_P and SW2_P are turned off, the inductor L2_P and the inductor L2_N are coupled directly. In this case, the coupling node of the inductor L2_P and the inductor L2_N is grounded in the sense of high frequency.

In contrast with this, when the switch SW1 is turned off and the switches SW2_P and SW2_N are turned on, the inductor L2# is coupled between the inductor L2_P and the inductor L2_N. In this case, the midpoint of the inductor L2# is grounded in the sense of high frequency.

The plus-side signal of the differential signal inputted into the filter circuit 180A is inputted into the notch filter which is configured with the inductors L1_P and L2_P and the variable capacitor C1_P. On the other hand, the negative-side signal of the differential signal inputted into the filter circuit 180A is inputted into the notch filter which is configured with the inductors L1_N and L2_N and the variable capacitor C1_N. In Embodiment 2, it is possible to substantially change the inductance of the inductors L2_P and L2_N, by switching coupling/uncoupling of the inductor L2# by the switches SW1, SW2_P, and SW2_N.

By adopting such a configuration, it is possible to adjust the peak frequency fpeak and the notch frequency fnotch of each notch filter independently with each other, with the use of the corresponding variable capacitor C1 and the variable inductor L2. Although not shown in the figure, it is possible to expand the variable range of the inductance of the inductors L2_P and L2_N, by adopting the configuration in which several pieces of series circuits each configured with the switch SW2_P, the inductor L2#, and the switch SW2_N are coupled in parallel between the inductor L2_P and the inductor L2_N.

FIG. 18 is a plan view illustrating an example of the configuration of the filter circuit 180A illustrated in FIG. 17. The filter circuit 180A illustrated in FIG. 18 is equivalent to the filter circuit 180 illustrated in FIG. 9 in which the switches SW1, SW2_P, and SW2_N, and the inductor L2# are provided in lieu of the variable capacitors C2_P and C2_N. The configuration of the variable capacitors C1_P and C1_N is the same as that of FIG. 10A and FIG. 10C; therefore, the detailed explanation thereof is not repeated.

The inductor L2# is formed with the use of the same metallic wiring MN-1 as the four inductors L1_P, L1_N, L2_P, and L2_N. The inductor L2# is arranged enclosing the outer circumference of the inductors L2_P and L2_N. Coupling/uncoupling of the inductor L2# with the inductors L2_P and L2_N are switched by the switches SW1, SW2_P, and SW_N. MOS transistors are applied to the switches SW1, SW2_P, and SW2_N, as an example. In response to a control signal CONT_L2 transmitted from the CPU (FIG. 11) of the RFIC 100 (not shown), the switches SW1, SW2_P, and SW2_N are turned on and off, respectively. In this way, it is possible to control the coupling/uncoupling of the inductors L2_P and L2_N with the inductor L2# by the control signal CONT_L2. Therefore, it is possible to adjust the inductance of the inductors L2_P and L2_N with the control signal CONT_L2.

It is possible to generate the control signal CONT_L2 by the CPU reading a program stored in the external memory element in advance, as is the case with the control signal CONT_C1<n:0>. Specifically, before the product shipment of the RFIC 100 (FIG. 1), the frequency characteristic of the filter circuit 180A is tuned up by a tuning circuit (not shown). This tuning is performed to each of plural bands of operation which are supported by the wireless communication device mounting the RFIC 100. For every band of operation, the capacitance of the variable capacitor C1 and the inductance of the variable inductor L2 are adjusted so as to set the frequency ratio of the peak frequency fpeak and the notch frequency fnotch to 3.

FIG. 19 is a flow chart illustrating a tuning operation of the frequency characteristic of the filter circuit 180A illustrated in FIG. 17.

As illustrated in FIG. 19, at Step S01, the band of operation to tune up the frequency characteristic and the frequency of the desired signal in the band of operation concerned are determined. A frequency of 3 times the frequency of the desired signal determined corresponds to the frequency of the third harmonic.

Then, a transmission RF signal corresponding to the desired signal determined is generated and inputted into the filter circuit 180A. On the basis of the transmission RF signal passing through the filter circuit 180A, the capacitance of the variable capacitor C1 and the inductance of the variable inductor L2 are adjusted.

Specifically, at first at Step S021, the inductance of the variable inductor L2 is selected so as to maximize the magnitude of the desired signal included in the transmission RF signal. Next at Step S031, with the use of the selected inductance of the variable inductor L2, the capacitance of the variable capacitor C1 is selected so as to minimize the magnitude of the third harmonic included in the transmission RF signal.

When the capacitance of the variable capacitor C1 and the inductance of the variable inductor L2 are selected, the flow advances to Step S04 and it is determined whether there exists another band of operation to be tuned up. When there exists another band of operation to be tuned up (YES at Step S04), the processing at Steps S01 to S031 is performed to the band of operation, and the capacitance of the variable capacitor C1 and the inductance of the variable inductor L2 are selected. When tuning has been performed to all the bands of operation (NO at Step S04), the flow is terminated.

In this way, for every band of operation, the capacitance of the variable capacitor C1 and the inductance of the variable inductor L2 are selected so as to set the frequency ratio to 3. The selected capacitance of the variable capacitor C1 and the selected inductance of the variable inductor L2 are associated with the band of operation, and are stored in the external memory element (FIG. 11) as a program.

By adopting such a configuration, in the use stage after the product shipment, the CPU reads the program corresponding to the band of operation to be employed from the external memory element, and on the basis of the capacitance and the inductance specified by the read program, the CPU generates the control signals CONT_C1<n:0> and CONT_L2. In response to these generated control signals, the switches SW0 to SWn, SW1, SW2_P, and SW2_N are turned on and off. Accordingly, the capacitance of the variable capacitor C1 and the inductance of the variable inductor L2 are adjusted to the optimal values for realizing the frequency ratio of 3 in the band of operation.

Operation-Effect of Embodiment 2

Figure 20:
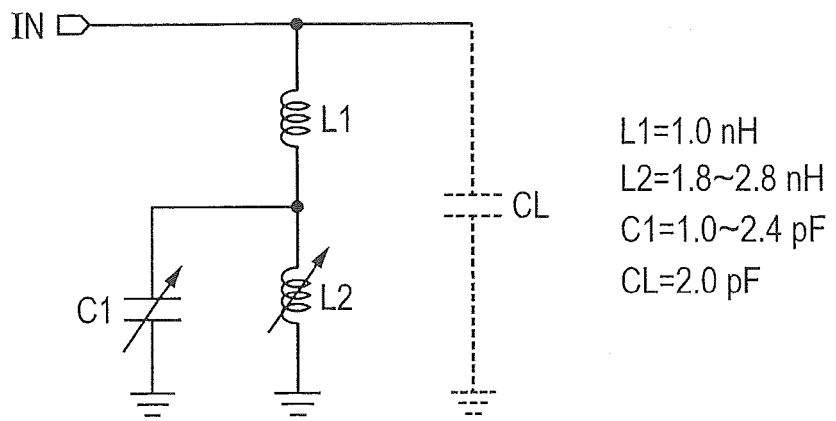
FIG. 20 is a drawing illustrating a simulation condition for analyzing the frequency characteristic of the filter circuit according to Embodiment 2.
Figure 21:
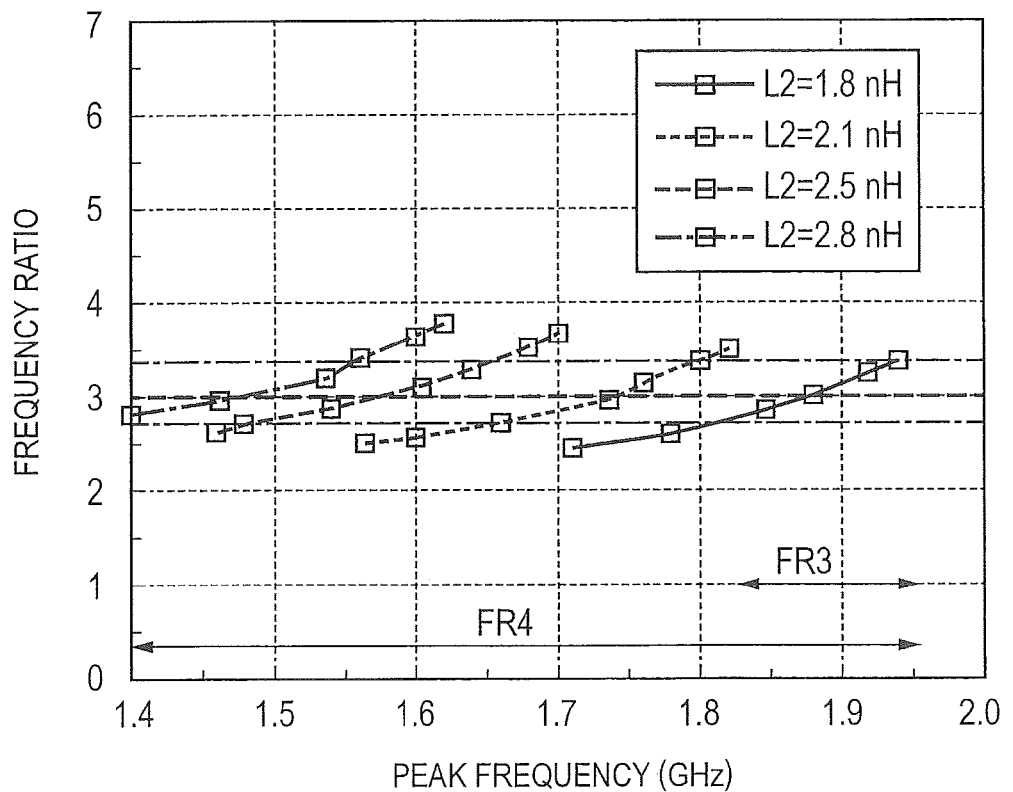
FIG. 21 is a drawing illustrating a simulation result of a relation between a frequency ratio and a peak frequency of the filter circuit.
Figure 22:
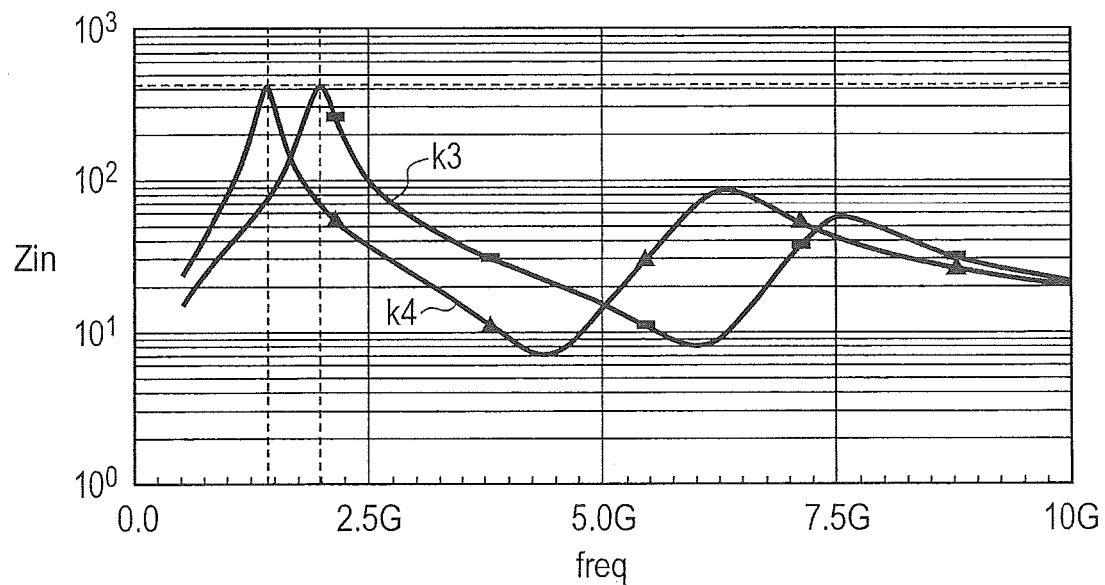
FIG. 22 is a drawing illustrating a simulation result of input impedance of the filter circuit by an electromagnetic field simulator.

With reference to FIG. 20 to FIG. 22, the following explains the result of simulation analysis on the frequency characteristic of the filter circuit according to Embodiment 2.

FIG. 20 illustrates a simulation condition. The simulation of the frequency characteristic of the filter circuit has been performed changing the capacitance of the variable capacitor C1 and the inductance of the variable inductor L2, respectively. FIG. 21 illustrates the simulation result of a relation between the frequency ratio and the peak frequency fpeak of the filter circuit. In the figure, changes of the peak frequency fpeak and the frequency ratio are shown when the capacitance of the variable capacitor C1 is changed, with the inductance of the variable inductor L2 as a parameter. The acceptable range of the frequency ratio (assuming 3±10% for example) is also shown in the figure.

As illustrated in FIG. 21, when the inductance of the variable inductor L2 is 1.8 nH, the frequency range of the peak frequency fpeak with the frequency ratio kept in the acceptable range is 1.82 GHz to 1.95 GHz (corresponding to the range FR3 in the figure). When the inductance of the variable inductor L2 is increased gradually, the frequency range of the peak frequency fpeak shifts to the low frequency side. When the inductance of the variable inductor L2 is increased up to 2.8 nH, the frequency range of the peak frequency fpeak covers 1.4 GHz to 1.95 GHz, expanding by about 4 times the frequency range when the variable inductor L2 sets to 1.8 nH. In this way, by changing the inductance of the variable inductor L2, it is possible to maintain the frequency ratio in the acceptable range over the broad frequency range.

FIG. 22 illustrates a simulation result of input impedance Zin of the filter circuit 180A by an electromagnetic field simulator. With the use of the electromagnetic field simulator, modeling has been performed by conducting electromagnetic field analysis of the differential inductor illustrated in FIG. 18. In this model, the capacitance of the variable capacitor C1 and the inductance of the variable inductor L2 are changed.

A solid line k3 in FIG. 22 is a simulation result of the input impedance Zin when the variable capacitor C1 is assumed to be 1.8 pF, and the switch SW1 is assumed to be turned on (the switches SW2_P and SW2_N are assumed to be turned off). A solid line k4 is a simulation result of the input impedance Zin when the variable capacitor C1 is assumed to be 2.9 pF, and the switches SW2_P and SW2_N are assumed to be turned on (the switch SW1 is assumed to be turned off). It is seen from the figure that by changing the capacitance of the variable capacitor C1 and the inductance of the variable inductor L2, the peak frequency fpeak and the notch frequency fnotch can be changed with the frequency ratio of 3 maintained.

In this way, according to the filter circuit according to Embodiment 2, it is possible to adjust the peak frequency and the notch frequency independently with the use of the variable capacitor C1 and the variable inductor L2 which are included in the notch filter; accordingly, it is possible to realize the frequency ratio 3 over a wide band. Therefore, it is possible to employ the filter circuit according to Embodiment 2 appropriately for the RFIC supporting the LTE in which the low distortion property and the multiband operation are required.

Embodiment 3

Figure 23:
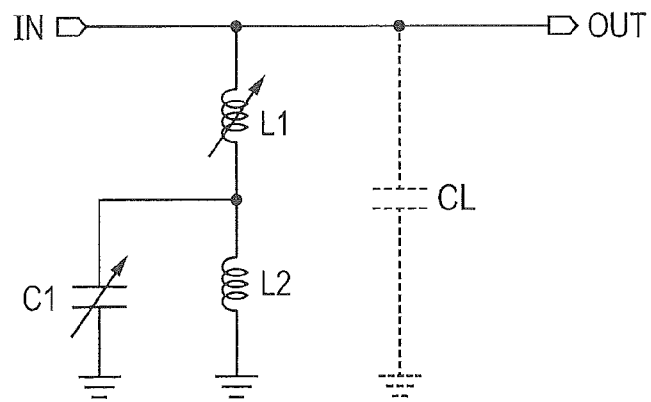
FIG. 23 is a circuit diagram illustrating a configuration of a single-ended filter circuit according to Embodiment 3.

FIG. 23 is a circuit diagram illustrating the configuration of a filter circuit according to Embodiment 3. FIG. 23 illustrates a single-ended filter circuit.

As illustrated in FIG. 23, The filter circuit according to Embodiment 3 is equivalent to the ideal notch filter illustrated in FIG. 3B in which the inductor L1 is replaced with a variable inductor. In the following explanation, the inductor L1 is expressed as a variable inductor L1.

In the notch filter illustrated in FIG. 23, when it is assumed that the inductance of the variable inductor L1 is L1, the inductance of the inductor L2 is L2, the capacitance of the variable capacitor C1 is C1, the parasitic capacitance of the signal line is CL, then, the peak frequency fpeak and the notch frequency fnotch are given by Equations (10) and (11), respectively. Equations (10) and (11) are the same as Equations (8) and (9), respectively.

[Mathematical 6]

$$\omega_{peak} \approx \frac{1}{\sqrt{L_1 C_1 + L_2(C_1 + C_L)}} \quad (10)$$

$$\omega_{notch} = \sqrt{\frac{L_1 + L_2}{L_1 L_2 C_1}} \quad (11)$$

The peak frequency fpeak changes depending on the capacitance C1 of the variable capacitor C1 and the inductance L1 of the variable inductor L1. The notch frequency fnotch changes depending on the capacitance C1 of the variable capacitor C1 and the inductance L1 of the variable inductor L1. In contrast to the filter circuit 180 according to Embodiment 1, both of the peak frequency fpeak and the notch frequency fnotch are dependent on the capacitance of the variable capacitor C1 and the inductance of the variable inductor L1. However, as described above, the capacitance of the variable capacitor C1 influences little to the peak frequency fpeak. Therefore, the peak frequency fpeak is substantially decided by the inductance of the variable inductor L1. Accordingly, it is possible to adjust the peak frequency fpeak and the notch frequency fnotch independently with each other, with the use of the variable capacitor C1 and the variable inductor L1.

Figure 24:
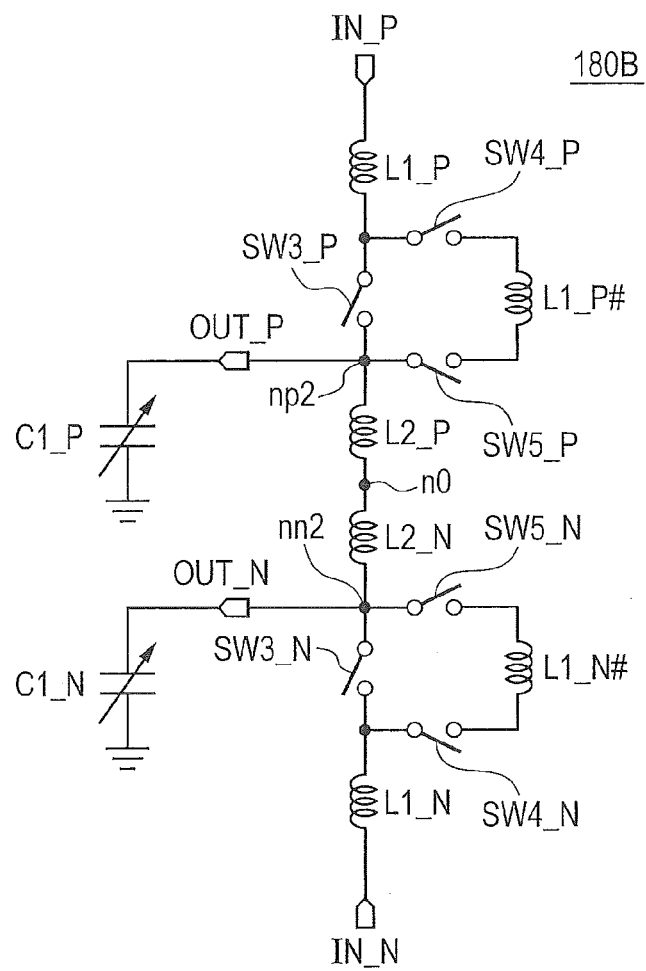
FIG. 24 is a circuit diagram illustrating an example of a configuration of a differential filter circuit according to Embodiment 3.

FIG. 24 is a circuit diagram illustrating an example of the configuration of a differential filter circuit 180B mounted in the RFIC 100 (FIG. 1). The filter circuit 180B according to Embodiment 3 is disposed between the QMOD 154 and the PGA 152 as is the case with the filter circuit 180 illustrated in FIG. 1.

The filter circuit 180B according to Embodiment 3 is configured with a notch filter. Among a pair of input terminals IN_P and IN_N of the filter circuit 180B, the plus-side input terminal IN_P receives the plus-side signal of the transmission RF signal as the differential signal, and the negative-side input terminal IN_N receives the negative-side signal of the transmission RF signal.

As illustrated in FIG. 24, the filter circuit 180B includes four inductors L1_P, L2_P, L2_N, and L1_N, and two variable capacitors C1_P and C1_N. The filter circuit 180B further includes inductors L1_P# and L1_N# and switches SW3_P, SW3_N, SW4_P, SW4_N, SW5_P, and SW5_N.

The four inductors L1_P, L2_P, L2_N, and L1_N are coupled in this order in series between the input terminal IN_P and the input terminal IN_N. The inductors L1_P and L1_N are coupled differentially to configure a differential inductor. Similarly, the inductors L2_P and L2_N also configure a differential inductor.

A coupling node np2 of the inductors L1_P and L2_P is coupled to a plus-side output terminal OUT_P. The variable capacitor C1_P is coupled between the plus-side output terminal OUT_P and the grounding line.

The coupling node nn2 of the inductors L1_N and L2_N is coupled to a negative-side output terminal OUT_N. The variable capacitor C1_N is coupled between the negative-side output terminal OUT_N and the grounding line.

The switch SW3_P is coupled between the inductor L1_P and the inductor L2_P. The switch SW4_P, the inductor L1_P#, and the switch SW5_P are coupled in this order in series between the inductor L1_P and the inductor L2_P. In response to a control signal CONT_L1 supplied from the CPU (FIG. 11), the switch SW3_P and two of the switches SW4_P and SW5_P are turned on and off complementarily. Specifically, when the switch SW3_P is turned on and the switches SW4_P and SW5_P are turned off, the inductor L1_P and the inductor L2_P are coupled directly.

In contrast with this, when the switch SW3_P is turned off and the switches SW4_P and SW5_P are turned on, the inductor L1_P# is coupled between the inductor L1_P and the inductor L2_P. In this way, when the switches SW3_P, SW4_P, and SW5_P are turned on and off in response to the control signal CONT_L1, the coupling/uncoupling of the inductor L1_P# is switched.

The switch SW3_N is coupled between the inductor L1_N and the inductor L2_N. The switch SW4_N, the inductor L1_N#, and the switch SW5_N are coupled in this order in series between the inductor L1_N and the inductor L2_N. In response to a control signal CONT_L1 supplied from the CPU (FIG. 11), the switch SW3_N and the two of the switches SW4_N and SW5_N are turned on and off complementarily. Specifically, when the switch SW3_N is turned on and the switches SW4_N and SW5_N are turned off, the inductor L1_N and the inductor L2_N are coupled directly.

In contrast with this, when the switch SW3_N is turned off and the switches SW4_N and SW5_N are turned on, the inductor L1_N# is coupled between the inductor L1_N and the inductor L2_N. In this way, when the switches SW3_N, SW4_N, and SW5_N are turned on and off in response to the control signal CONT_L1, the coupling/uncoupling of the inductor L1_N# is switched.

The plus-side signal of the differential signal inputted into the filter circuit 180B is inputted into the notch filter which is configured with the inductors L1_P and L2_P and the variable capacitor C1_P. On the other hand, the negative-side signal of the differential signal inputted into the filter circuit 180B is inputted into the notch filter which is configured with the inductors L1_N and L2_N and the variable capacitor C1_N. In Embodiment 3, by switching the coupling/uncoupling of the inductors L1_P# and L1_N# in response to the control signal CONT_L1, it is possible to change the inductance of the inductors L1_P and L1_N substantially.

By adopting such a configuration, it is possible to adjust the peak frequency fpeak and the notch frequency (notch of each notch filter independently with each other, with the use of the corresponding variable capacitor C1 and the variable inductor L1. Although not shown in the figure, it is possible to expand the variable range of the inductance of the inductor L1_P, by adopting the configuration in which several pieces of series circuits each configured with the switch SW4_P, the inductor L1_P#, and the switch SW5_P are coupled in parallel between the inductor L1_P and the inductor L2_P. Similarly, it is possible to expand the variable range of the inductance of the inductor L1_N, by adopting the configuration in which several pieces of series circuits each configured with the switch SW4_N, the inductor L1_N#, and the switch SW5_N are coupled in parallel between the inductor L1_N and the inductor L2_N.

It is possible to generate the control signal CONT_L1 by the CPU reading a program stored in the external memory element in advance, as is the case with the control signal CONT_C1<n:0>. Specifically, before the product shipment of the RFIC 100 (FIG. 1), the frequency characteristic of the filter circuit 180B is tuned up by a tuning circuit (not shown). This tuning is performed to each of plural bands of operation which are supported by the wireless communication device mounting the RFIC 100. For every band of operation, the capacitance of the variable capacitor C1 and the inductance of the variable inductor L1 are adjusted so as to set the frequency ratio of the peak frequency fpeak and the notch frequency fnotch to 3.

Figure 25:
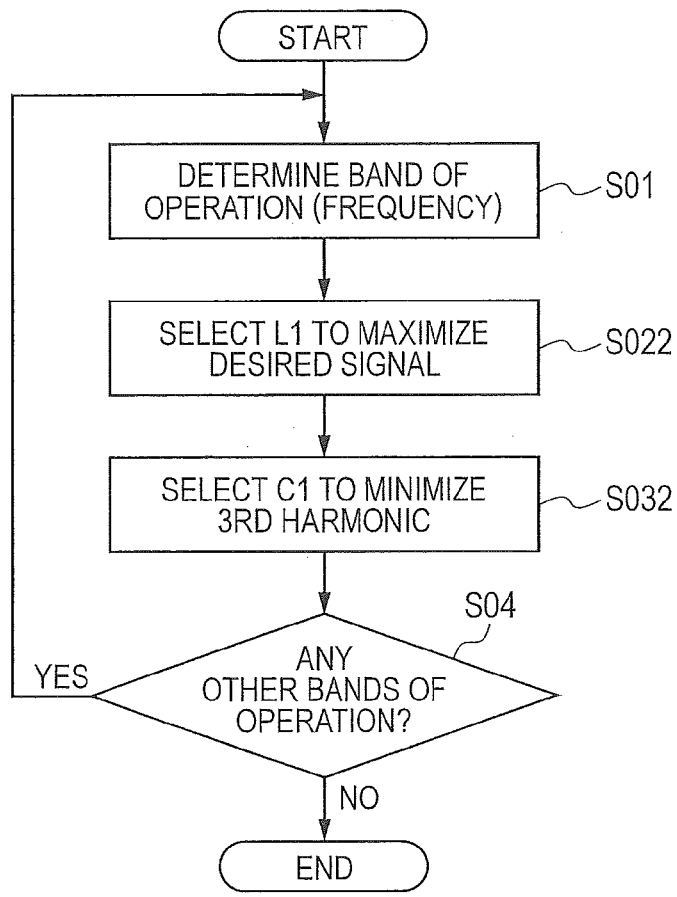
FIG. 25 is a flow chart illustrating a tuning operation of the frequency characteristic of the filter circuit illustrated in FIG. 24.

FIG. 25 is a flow chart illustrating a tuning operation of the frequency characteristic of the filter circuit 180B illustrated in FIG. 24.

As illustrated in FIG. 25, at Step S01, the band of operation to tune up the frequency characteristic and the frequency of the desired signal in the band of operation concerned are determined. A frequency of 3 times the frequency of the desired signal determined corresponds to the frequency of the third harmonic.

Then, a transmission RF signal corresponding to the desired signal determined is generated and inputted into the filter circuit 180B. On the basis of the transmission RF signal passing through the filter circuit 180B, the capacitance of the variable capacitor C1 and the inductance of the variable inductor L1 are adjusted.

Specifically, at first at Step S022, the inductance of the variable inductor L1 is selected so as to maximize the magnitude of the desired signal included in the transmission RF signal. Next at Step S032, with the use of the selected inductance of the variable inductor L1, the capacitance of the variable capacitor C1 is selected so as to minimize the magnitude of the third harmonic included in the transmission RF signal.

When the capacitance of the variable capacitor C1 and the inductance of the variable inductor L1 are selected, the flow advances to Step S04 and it is determined whether there exists another band of operation to be tuned up. When there exists another band of operation to be tuned up (YES at Step S04), processing of Steps S01 to S032 is performed to the band of operation, and the capacitance of the variable capacitor C1 and the inductance of the variable inductor L1 are selected. When tuning has been performed to all the bands of operation (NO at Step S04), the operation is terminated.

In this way, for every band of operation, the capacitance of the variable capacitor C1 and the inductance of the variable inductor L1 are selected so as to set the frequency ratio to 3. The selected capacitance of the variable capacitor C1 and the selected inductance of the variable inductor L1 are associated with the band of operation, and are stored in the external memory element (FIG. 11) as a program.

By adopting such a configuration, in the use stage after the product shipment, the CPU reads the program corresponding to the band of operation to be employed from the external memory element, and on the basis of the capacitance and the inductance specified by the read program, the CPU generates the control signals CONT_C1<n:0> and CONT_L1. In response to these generated control signals, the switches SW0 to SWn, SW3_P, SW3_N, SW4_P, SW4_N, SW5_P, and SW5_N are turned on and off. Accordingly, the capacitance of the variable capacitor C1 and the inductance of the variable inductor L1 are adjusted to the optimal values for realizing the frequency ratio of 3 in the band of operation.

Operation-Effect of Embodiment 3

Figure 26:
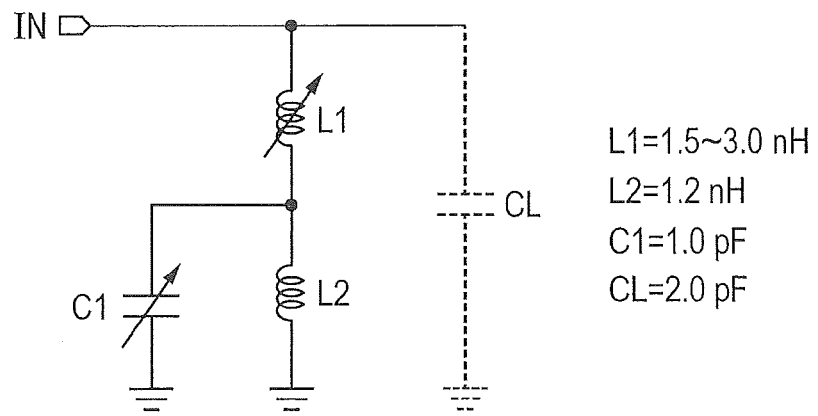
FIG. 26 is a drawing illustrating a simulation condition for analyzing the frequency characteristic of the filter circuit according to Embodiment 3.
Figure 27:
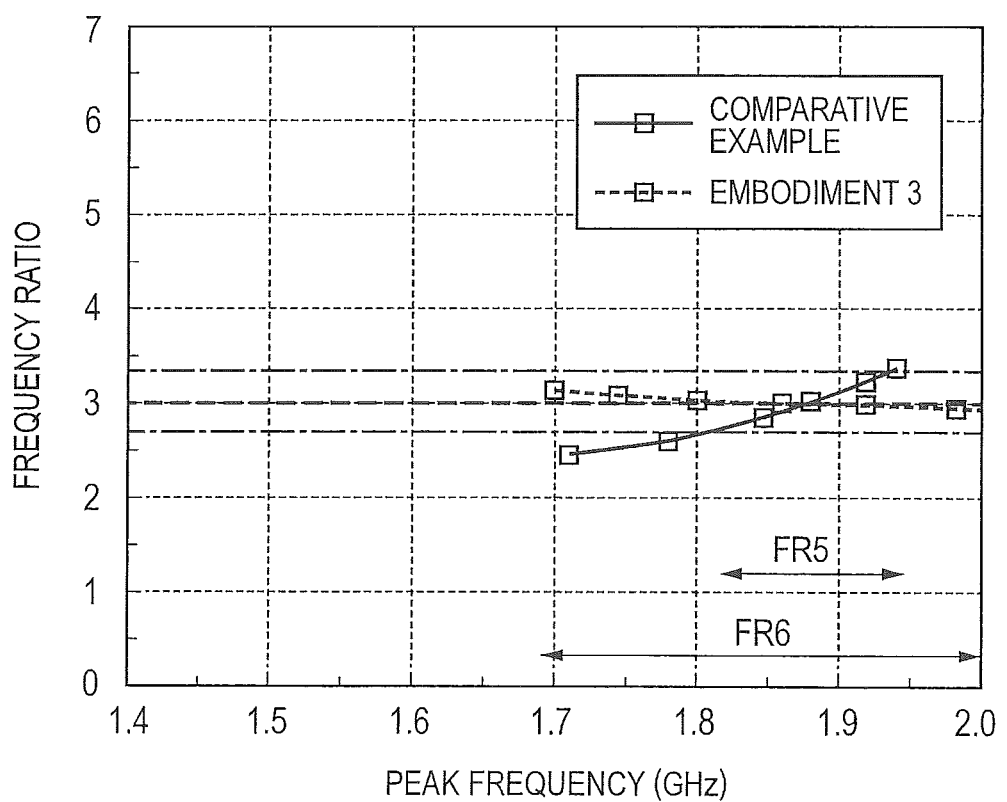
FIG. 27 is a drawing illustrating a simulation result of a relation between a frequency ratio and a peak frequency of the filter circuit.

With reference to FIG. 26 and FIG. 27, the following explains the result of simulation analysis on the frequency characteristic of the filter circuit according to Embodiment 3.

FIG. 26 illustrates a simulation condition. The simulation of the frequency characteristic of the filter circuit has been performed changing the inductance of the variable inductor L1. FIG. 27 illustrates the simulation result of a relation between the frequency ratio and the peak frequency fpeak of the filter circuit. In the figure, changes of the frequency ratio and the peak frequency fpeak are shown when changing the inductance of the variable inductor L1. A comparative example illustrated in the figure is the simulation result of the relation of the frequency ratio and the peak frequency fpeak of the filter circuit when the inductance of the inductor L1 is fixed and only the capacitance of the variable capacitor C1 is changed.

As illustrated in FIG. 27, when the inductance of the variable inductor L1 is 1.5 nH, the frequency range of the peak frequency fpeak with the frequency ratio kept in the acceptable range is 1.82 GHz to 1.95 GHz (corresponding to the range FR5 in the figure). On the other hand, the frequency range of the peak frequency fpeak expands to the high frequency side and the low frequency side by changing the inductance of the variable inductor L1. When the inductance of the variable inductor L1 is increased up to 3.0 nH, the frequency range of the peak frequency fpeak is 1.7 GHz-2.0 GHz, and is expanded by about 4 times the frequency range in the case of the variable inductor L1 set to 1.5 nH. In this way, by changing the inductance of the variable inductor L1, it is possible to maintain the frequency ratio in the acceptable range over the broad frequency range.

In this way, according to the filter circuit according to Embodiment 3, it is possible to adjust the peak frequency and the notch frequency independently, with the use of the variable capacitor C1 and the variable inductor L1 which are included in the notch filter; accordingly, it is possible to realize the frequency ratio 3 over a wide band. Therefore, it is possible to employ the filter circuit according to Embodiment 3 appropriately for the RFIC supporting the LTE in which the low distortion property and the multiband operation are required.

As described above, the invention accomplished by the present inventors has been concretely explained based on various embodiments. However, it cannot be overemphasized that the present invention is not restricted to the embodiments, and it can be changed variously in the range which does not deviate from the gist.

Embodiments 1 to 3 illustrate the configuration of the filter circuit provided in the transmitting unit TX of the RFIC 100 (FIG. 1). However, it is possible to apply the invention of the present application also to a filter circuit provided in the receiving unit RX.

Embodiment 1 explains the configuration of the filter circuit including the variable capacitors C1 and C2 and Embodiments 2 and 3 explain the configuration of the filter circuit including the variable inductor L1 (or L2). However, generally speaking, the adjustment of capacitance of a variable capacitor is easier than the adjustment of inductance of a variable inductor from the point of view of design and realization. Therefore, it can be said that Embodiment 1 is superior in respect of practicality.

What is claimed is:

1. A semiconductor device comprising:
a filter circuit operable to pass a desired signal component of a high-frequency signal inputted and operable to attenuate a harmonic component of an integral multiple of the desired signal,
wherein the filter circuit comprises:
a first inductor and a second inductor coupled in series to a signal line transmitting the high-frequency signal;
a first variable capacitor coupled between a power supply line and a node of the first inductor and the second inductor; and
a second variable capacitor coupled between the signal line and the power supply line,
wherein the filter circuit further comprises:
a first input terminal and a second input terminal operable to receive the high-frequency signal as a differential signal,
wherein the first inductor and the second inductor are formed by a first differential inductor and a second differential inductor coupled in series between the first input terminal and the second input terminal,
wherein the first variable capacitor is coupled between the power supply line and a node of the first differential inductor and the second differential inductor, and
wherein the second variable capacitor is coupled between the first input terminal and the power supply line and between the second input terminal and the power supply line.

2. The semiconductor device according to claim 1,
wherein the frequency of the desired signal component is adjusted by capacitance values of the first variable capacitor and the second variable capacitor, and the frequency of the harmonic component is adjusted by a capacitance value of the first variable capacitor.

3. The semiconductor device according to claim 1 further comprising:
a quadrature modulator operable to upconvert a baseband signal received from a baseband circuit with the use of a local oscillation signal, and operable to output the high-frequency signal; and
a transmission amplifier circuit operable to amplify the high-frequency signal generated by the quadrature modulator,
wherein, upon receiving the high-frequency signal from the quadrature modulator, the filter circuit supplies the high-frequency signal having the attenuated high-frequency component to the transmission amplifier circuit.

4. The semiconductor device according to claim 1 further comprising:
a central processing unit operable to execute a program associated therewith, and being coupled to said first variable capacitor and said second variable capacitor,
wherein each capacitance value of the first variable capacitor and the second variable capacitor is set up by the central processing unit.

5. A semiconductor device comprising:
a filter circuit operable to pass a desired signal component of a high-frequency signal inputted and operable to attenuate a harmonic component of an integral multiple of the desired signal,
wherein the filter circuit comprises:
a first inductor and a second inductor coupled in series to a signal line transmitting the high-frequency signal;
a first variable capacitor coupled between a power supply line and a node of the first inductor and the second inductor; and
a second variable capacitor coupled between the signal line and the power supply line,
wherein the signal line configures one signal line of a signal-line pair for receiving the high-frequency signal as a differential signal,
wherein the filter circuit further comprises:
a third inductor and a fourth inductor coupled in series to the other signal line of the signal-line pair;
a third variable capacitor coupled between the power supply line and a node of the third inductor and the fourth inductor; and
a fourth variable capacitor coupled between the other signal line and the power supply line, and
wherein the first inductor to the fourth inductor are coupled in series between the one signal line and the other signal line.

6. The semiconductor device according to claim 5,
wherein the frequency of the desired signal component is adjusted by capacitance values of the first variable capacitor to the fourth variable capacitor, and the frequency of the high-frequency component is adjusted by capacitance values of the first variable capacitor and the third variable capacitor.

7. The semiconductor device according to claim 5 further comprising:

a central processing unit operable to execute a program associated therewith, and being coupled to said first variable capacitor to said fourth variable capacitor, wherein each capacitance value of the first variable capacitor to the fourth variable capacitor is set up by the central processing unit.

8. A semiconductor device comprising:

a filter circuit operable to pass a desired signal component of a high-frequency signal inputted and operable to attenuate a harmonic component of an integral multiple of the desired signal, wherein the filter circuit comprises:

a first inductor and a second inductor coupled in series to a signal line transmitting the high-frequency signal;

a first variable capacitor coupled between a power supply line and a node of the first inductor and the second inductor; and wherein one of the first inductor and the second inductor comprises a variable inductor;

wherein the filter circuit further comprises:

a first input terminal and a second input terminal operable to receive the high-frequency signal as a differential signal, wherein the first inductor and the second inductor are formed by a first differential inductor and a second differential inductor coupled in series between the first input terminal and the second input terminal, and wherein the first variable capacitor is coupled between a node of the first differential inductor and the second differential inductor and the power supply line.

9. The semiconductor device according to claim 8, wherein the frequencies of the desired signal component and the high-frequency component are adjusted by an inductance value of the variable inductor and a capacitance value of the first variable capacitor.

10. The semiconductor device according to claim 8 further comprising:

a quadrature modulator operable to upconvert a baseband signal received from a baseband circuit with the use of a local oscillation signal, and operable to output the high-frequency signal; and a transmission amplifier circuit operable to amplify the high-frequency signal generated by the quadrature modulator, wherein, upon receiving the high-frequency signal from the quadrature modulator, the filter circuit supplies the high-frequency signal having the attenuated high-frequency component to the transmission amplifier circuit.

11. The semiconductor device according to claim 8 further comprising:

a central processing unit operable to execute a program associated therewith, and being coupled to said variable inductor and said variable capacitor, wherein an inductance value of the variable inductor and a capacitance value of the variable capacitor are set up by the central processing unit.

12. A semiconductor device comprising:

a filter circuit operable to pass a desired signal component of a high-frequency signal inputted and operable to attenuate a harmonic component of an integral multiple of the desired signal, wherein the filter circuit comprises:

a first inductor and a second inductor coupled in series to a signal line transmitting the high-frequency signal;

a first variable capacitor coupled between a power supply line and a node of the first inductor and the second inductor; and wherein one of the first inductor and the second inductor comprises a variable inductor;

wherein the signal line configures one signal line of a signal-line pair for receiving the high-frequency signal as a differential signal, wherein the filter circuit further comprises:

a third inductor coupled to the other signal line of the signal-line pair; and a second variable capacitor coupled between the power supply line and a node of the second inductor and the third inductor, wherein the first inductor to the third inductor are coupled in series between the one signal line and the other signal line, and wherein the second inductor comprises a variable inductor.

13. The semiconductor device according to claim 12, wherein the frequencies of the desired signal component and the high-frequency component are adjusted by an inductance value of the variable inductor and capacitance values of the first variable capacitor and the second variable capacitor.

\* \* \* \* \*